United States Patent
Biberger et al.

(10) Patent No.: US 7,255,772 B2
(45) Date of Patent: Aug. 14, 2007

(54) HIGH PRESSURE PROCESSING CHAMBER FOR SEMICONDUCTOR SUBSTRATE

(75) Inventors: Maximilian A. Biberger, Palo Alto, CA (US); Frederick Paul Layman, Fremont, CA (US); Thomas Robert Sutton, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 430 days.

(21) Appl. No.: 10/897,296

(22) Filed: Jul. 21, 2004

(65) Prior Publication Data
US 2005/0000651 A1 Jan. 6, 2005

Related U.S. Application Data

(63) Continuation of application No. 09/912,844, filed on Jul. 24, 2001, now Pat. No. 6,921,456.

(60) Provisional application No. 60/283,132, filed on Apr. 10, 2001, provisional application No. 60/220,883, filed on Jul. 26, 2000.

(51) Int. Cl.
*H01L 21/00* (2006.01)
*C23C 16/00* (2006.01)
*C23C 14/00* (2006.01)

(52) U.S. Cl. .............................. 156/345.26; 156/345.1; 118/715; 134/1.1; 134/1.2; 134/1.3; 438/631; 438/645; 430/256

(58) Field of Classification Search .......... 156/345.26, 156/345.1; 118/715; 134/1.1, 1.2, 1.3; 438/631, 438/645; 430/256
See application file for complete search history.

(56) References Cited

U.S. PATENT DOCUMENTS

| | | | |
|---|---|---|---|
| 2,617,719 A | 11/1952 | Stewart | ........................ 23/312 |
| 2,625,886 A | 1/1953 | Browne | ...................... 103/150 |
| 2,873,597 A | 2/1959 | Fahringer | |
| 3,521,765 A | 7/1970 | Kauffman et al. | |
| 3,623,627 A | 11/1971 | Bolton | |

(Continued)

FOREIGN PATENT DOCUMENTS

CH          SE 251213          8/1948

(Continued)

OTHER PUBLICATIONS

J.B. Rubin et al. "A Comparison of Chilled DI Water/Ozone and Co2-Based Supercritical Fluids as Replacements for Photoresist-Stripping Solvents", IEEE/CPMT Int'l Electronics Manufacturing Technology Symposium, 1998, pp. 308-314.

(Continued)

Primary Examiner—Ram N. Kackar
(74) Attorney, Agent, or Firm—Haverstock & Owens LLP

(57) ABSTRACT

A high pressure chamber comprises a chamber housing, a platen, and a mechanical drive mechanism. The chamber housing comprises a first sealing surface. The platen comprises a region for holding the semiconductor substrate and a second sealing surface. The mechanical drive mechanism couples the platen to the chamber housing. In operation, the mechanical drive mechanism separates the platen from the chamber housing for loading of the semiconductor substrate. In further operation, the mechanical drive mechanism causes the second sealing surface of the platen and the first sealing surface of the chamber housing to form a high pressure processing chamber around the semiconductor substrate.

24 Claims, 12 Drawing Sheets

U.S. PATENT DOCUMENTS

| | | | |
|---|---|---|---|
| 3,681,171 A | 8/1972 | Hojo et al. | |
| 3,689,025 A | 9/1972 | Kiser | |
| 3,744,660 A | 7/1973 | Gaines et al. | 220/10 |
| 3,968,885 A | 7/1976 | Hassan et al. | 214/1 BC |
| 4,029,517 A | 6/1977 | Rand | 134/11 |
| 4,091,643 A | 5/1978 | Zucchini | 68/18 C |
| 4,145,161 A | 3/1979 | Skinner | |
| 4,245,154 A | 1/1981 | Uehara et al. | 250/227 |
| 4,341,592 A | 7/1982 | Shortes et al. | 156/643 |
| 4,355,937 A | 10/1982 | Mack et al. | 414/217 |
| 4,367,140 A | 1/1983 | Wilson | 210/110 |
| 4,391,511 A | 7/1983 | Akiyama et al. | |
| 4,406,596 A | 9/1983 | Budde | 417/393 |
| 4,422,651 A | 12/1983 | Platts | 277/206 R |
| 4,426,358 A | 1/1984 | Johansson | |
| 4,474,199 A | 10/1984 | Blaudszun | 134/105 |
| 4,522,788 A | 6/1985 | Sitek et al. | 422/78 |
| 4,549,467 A | 10/1985 | Wilden et al. | 91/307 |
| 4,574,184 A | 3/1986 | Wolf et al. | |
| 4,592,306 A | 6/1986 | Gallego | 118/719 |
| 4,601,181 A | 7/1986 | Privat | 68/18 C |
| 4,626,509 A | 12/1986 | Lyman | 435/287 |
| 4,670,126 A | 6/1987 | Messer et al. | 204/298 |
| 4,682,937 A | 7/1987 | Credle, Jr. | 417/393 |
| 4,693,777 A | 9/1987 | Hazano et al. | 156/345 |
| 4,749,440 A | 6/1988 | Blackwood et al. | 156/646 |
| 4,778,356 A | 10/1988 | Hicks | 417/397 |
| 4,788,043 A | 11/1988 | Kagiyama et al. | 422/292 |
| 4,789,077 A | 12/1988 | Noe | 220/319 |
| 4,823,976 A | 4/1989 | White, III et al. | 220/211 |
| 4,825,808 A | 5/1989 | Takahashi et al. | 118/719 |
| 4,827,867 A | 5/1989 | Takei et al. | 118/64 |
| 4,838,476 A | 6/1989 | Rahn | 228/180.1 |
| 4,865,061 A | 9/1989 | Fowler et al. | 134/108 |
| 4,879,431 A | 11/1989 | Bertoncini | 435/311 |
| 4,917,556 A | 4/1990 | Stark et al. | 414/217 |
| 4,924,892 A | 5/1990 | Kiba et al. | 134/123 |
| 4,944,837 A | 7/1990 | Nishikawa et al. | 156/646 |
| 4,951,601 A | 8/1990 | Maydan et al. | 118/719 |
| 4,960,140 A | 10/1990 | Ishijima et al. | 134/31 |
| 4,983,223 A | 1/1991 | Gessner | 134/25.4 |
| 5,009,738 A | 4/1991 | Gruenwald et al. | |
| 5,011,542 A | 4/1991 | Weil | 134/38 |
| 5,013,366 A | 5/1991 | Jackson et al. | 134/1 |
| 5,044,871 A | 9/1991 | Davis et al. | 414/786 |
| 5,062,770 A | 11/1991 | Story et al. | 417/46 |
| 5,068,040 A | 11/1991 | Jackson | 210/748 |
| 5,071,485 A | 12/1991 | Matthews et al. | 134/2 |
| 5,105,556 A | 4/1992 | Kurokawa et al. | 34/12 |
| 5,143,103 A | 9/1992 | Basso et al. | 134/98.1 |
| 5,167,716 A | 12/1992 | Boitnott et al. | 118/719 |
| 5,169,296 A | 12/1992 | Wilden | 417/395 |
| 5,169,408 A | 12/1992 | Biggerstaff et al. | 29/25.01 |
| 5,185,296 A | 2/1993 | Morita et al. | 437/229 |
| 5,186,594 A | 2/1993 | Toshima et al. | 414/217 |
| 5,186,718 A | 2/1993 | Tepman et al. | 29/25.01 |
| 5,188,515 A | 2/1993 | Horn | 417/63 |
| 5,190,373 A | 3/1993 | Dickson et al. | 366/146 |
| 5,191,993 A | 3/1993 | Wanger et al. | 220/333 |
| 5,193,560 A | 3/1993 | Tanaka et al. | 134/56 R |
| 5,195,878 A | 3/1993 | Sahiavo et al. | 417/393 |
| 5,213,485 A | 5/1993 | Wilden | 417/393 |
| 5,213,619 A | 5/1993 | Jackson et al. | 134/1 |
| 5,215,592 A | 6/1993 | Jackson | 134/1 |
| 5,217,043 A | 6/1993 | Novakovi | 137/460 |
| 5,221,019 A | 6/1993 | Pechacek | 220/315 |
| 5,222,876 A | 6/1993 | Budde | 417/393 |
| 5,224,504 A | 7/1993 | Thompson et al. | 134/155 |
| 5,236,602 A | 8/1993 | Jackson | 210/748 |
| 5,236,669 A | 8/1993 | Simmons et al. | 422/113 |
| 5,237,824 A | 8/1993 | Pawliszyn | 62/51.1 |
| 5,240,390 A | 8/1993 | Kvinge et al. | 417/393 |
| 5,242,641 A * | 9/1993 | Horner et al. | 264/104 |
| 5,243,821 A | 9/1993 | Schuck et al. | 62/50.6 |
| 5,246,500 A | 9/1993 | Samata et al. | 118/719 |
| 5,251,776 A | 10/1993 | Morgan, Jr. et al. | 220/360 |
| 5,252,041 A | 10/1993 | Schumack | |
| 5,259,731 A | 11/1993 | Dhindsa et al. | |
| 5,267,455 A | 12/1993 | Dewees et al. | 68/5 C |
| 5,280,693 A | 1/1994 | Heudecker | 53/306 |
| 5,285,352 A | 2/1994 | Pastore et al. | 361/707 |
| 5,288,333 A | 2/1994 | Tanaka et al. | 134/31 |
| 5,304,515 A | 4/1994 | Morita et al. | 437/231 |
| 5,306,350 A | 4/1994 | Hoy et al. | 134/22.14 |
| 5,313,965 A | 5/1994 | Palen | 134/61 |
| 5,314,574 A | 5/1994 | Takahashi | 156/646 |
| 5,316,591 A | 5/1994 | Chao et al. | 134/34 |
| 5,328,722 A | 7/1994 | Ghanayem et al. | 427/250 |
| 5,337,446 A | 8/1994 | Smith et al. | 15/21.1 |
| 5,339,844 A | 8/1994 | Stanford, Jr. et al. | 134/107 |
| 5,355,901 A | 10/1994 | Mielnik et al. | 134/105 |
| 5,368,171 A | 11/1994 | Jackson | 134/147 |
| 5,370,740 A | 12/1994 | Chao et al. | 134/1 |
| 5,370,741 A | 12/1994 | Bergman | 134/3 |
| 5,374,829 A | 12/1994 | Sakamoto et al. | |
| 5,377,705 A | 1/1995 | Smith, Jr. et al. | 134/95.3 |
| 5,401,322 A | 3/1995 | Marshall | 134/13 |
| 5,403,621 A | 4/1995 | Jackson et al. | 427/255.1 |
| 5,404,894 A | 4/1995 | Shiraiwa | 134/66 |
| 5,412,958 A | 5/1995 | Iliff et al. | 68/5 C |
| 5,417,768 A | 5/1995 | Smith, Jr. et al. | 134/10 |
| 5,433,334 A | 7/1995 | Reneau | 220/319 |
| 5,434,107 A * | 7/1995 | Paranjpe | 438/760 |
| 5,447,294 A | 9/1995 | Sakata et al. | 266/257 |
| 5,456,759 A | 10/1995 | Stanford, Jr. et al. | 134/1 |
| 5,474,410 A | 12/1995 | Ozawa et al. | |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,503,176 A | 4/1996 | Dunmire et al. | 137/15 |
| 5,505,219 A | 4/1996 | Lansberry et al. | 134/105 |
| 5,509,431 A | 4/1996 | Smith, Jr. et al. | 134/95.1 |
| 5,522,938 A | 6/1996 | O'Brien | 134/1 |
| 5,526,834 A | 6/1996 | Mielnik et al. | 134/105 |
| 5,533,538 A | 7/1996 | Marshall | 134/104.4 |
| 5,540,554 A | 7/1996 | Masuzawa | |
| 5,571,330 A | 11/1996 | Kyogoku | 118/719 |
| 5,589,224 A | 12/1996 | Tepman et al. | 427/248.1 |
| 5,621,982 A | 4/1997 | Yamashita et al. | 34/203 |
| 5,629,918 A | 5/1997 | Ho et al. | 369/112 |
| 5,644,855 A | 7/1997 | McDermott et al. | 34/516 |
| 5,649,809 A | 7/1997 | Stapelfeldt | 417/63 |
| 5,656,097 A | 8/1997 | Olesen et al. | 134/1 |
| 5,669,251 A | 9/1997 | Townsend et al. | 68/58 |
| 5,672,204 A | 9/1997 | Habuka | 117/204 |
| 5,679,169 A | 10/1997 | Gonzales et al. | |
| 5,683,977 A | 11/1997 | Jureller et al. | 510/286 |
| 5,702,228 A | 12/1997 | Tamai et al. | 414/744.5 |
| 5,706,319 A | 1/1998 | Holtz | 376/203 |
| 5,746,008 A | 5/1998 | Yamashita et al. | 34/211 |
| 5,769,588 A | 6/1998 | Toshima et al. | 414/217 |
| 5,772,783 A | 6/1998 | Stucker | |
| 5,797,719 A | 8/1998 | James et al. | 417/46 |
| 5,798,126 A | 8/1998 | Fujikawa et al. | 425/78 |
| 5,817,178 A | 10/1998 | Mita et al. | 118/666 |
| 5,850,747 A | 12/1998 | Roberts et al. | |
| 5,858,107 A | 1/1999 | Chao et al. | |
| 5,865,602 A | 2/1999 | Nozari | |
| 5,868,856 A | 2/1999 | Douglas et al. | 134/2 |
| 5,868,862 A | 2/1999 | Douglas et al. | 134/26 |
| 5,879,459 A | 3/1999 | Gadgil et al. | |
| 5,881,577 A | 3/1999 | Sauer et al. | 68/5 |
| 5,882,165 A | 3/1999 | Maydan et al. | 414/217 |
| 5,888,050 A | 3/1999 | Fitzgerald et al. | 417/46 |

| | | | |
|---|---|---|---|
| 5,898,727 A | 4/1999 | Fujikawa et al. ............ 373/110 |
| 5,900,107 A | 5/1999 | Murphy et al. ............. 156/359 |
| 5,900,354 A | 5/1999 | Batchelder ................ 430/395 |
| 5,904,737 A | 5/1999 | Preston et al. ................ 8/158 |
| 5,906,866 A | 5/1999 | Webb ........................ 427/534 |
| 5,908,510 A | 6/1999 | McCullough et al. .......... 134/2 |
| 5,928,389 A | 7/1999 | Jevtic ....................... 29/25.01 |
| 5,932,100 A | 8/1999 | Yager et al. ................ 210/634 |
| 5,934,856 A | 8/1999 | Asakawa et al. ........... 414/217 |
| 5,934,991 A | 8/1999 | Rush ......................... 454/187 |
| 5,943,721 A | 8/1999 | Lerette et al. |
| 5,946,945 A | 9/1999 | Kegler et al. |
| 5,955,140 A | 9/1999 | Smith et al. ................. 427/96 |
| 5,970,554 A | 10/1999 | Shore et al. |
| 5,971,714 A | 10/1999 | Schaffer et al. |
| 5,975,492 A | 11/1999 | Brenes ....................... 251/175 |
| 5,976,264 A | 11/1999 | McCullough et al. .......... 134/2 |
| 5,979,306 A | 11/1999 | Fujikawa et al. ............. 100/90 |
| 5,980,648 A | 11/1999 | Adler ......................... 134/34 |
| 5,981,399 A | 11/1999 | Kawamura et al. ........... 438/715 |
| 5,989,342 A | 11/1999 | Ikeda et al. .................. 118/52 |
| 6,005,226 A | 12/1999 | Aschner et al. ............. 219/390 |
| 6,017,820 A | 1/2000 | Ting et al. .................. 438/689 |
| 6,021,791 A | 2/2000 | Dryer et al. |
| 6,024,801 A | 2/2000 | Wallace et al. ................ 134/1 |
| 6,029,371 A | 2/2000 | Kamikawa et al. ........... 34/516 |
| 6,035,871 A | 3/2000 | Eui-Yeol ..................... 134/61 |
| 6,037,277 A | 3/2000 | Masakara et al. ........... 438/787 |
| 6,041,817 A | 3/2000 | Guertin |
| 6,045,331 A | 4/2000 | Gehm et al. |
| 6,048,494 A | 4/2000 | Annapragada |
| 6,053,348 A | 4/2000 | Morch ........................ 220/263 |
| 6,056,008 A | 5/2000 | Adams et al. ........... 137/487.5 |
| 6,062,853 A | 5/2000 | Shimazu et al. |
| 6,067,728 A | 5/2000 | Farmer et al. ................ 34/470 |
| 6,070,440 A | 6/2000 | Malchow et al. |
| 6,077,053 A | 6/2000 | Fujikawa et al. ............ 417/399 |
| 6,077,321 A | 6/2000 | Adachi et al. ............... 29/25.01 |
| 6,082,150 A | 7/2000 | Stucker ....................... 68/18 R |
| 6,085,935 A | 7/2000 | Malchow et al. ............ 220/813 |
| 6,089,377 A | 7/2000 | Shimizu |
| 6,097,015 A | 8/2000 | McCullough et al. ........ 219/686 |
| 6,103,638 A * | 8/2000 | Robinson .................... 438/778 |
| 6,109,296 A | 8/2000 | Austin |
| 6,110,232 A | 8/2000 | Chen et al. ................. 29/25.01 |
| 6,122,566 A | 9/2000 | Nguyen et al. ............. 700/218 |
| 6,123,510 A | 9/2000 | Greer et al. |
| 6,128,830 A | 10/2000 | Bettcher et al. ............... 34/404 |
| 6,145,519 A | 11/2000 | Konishi et al. ............. 134/95.2 |
| 6,149,828 A | 11/2000 | Vaartstra ...................... 216/57 |
| 6,159,295 A | 12/2000 | Maskara et al. ............ 118/688 |
| 6,164,297 A | 12/2000 | Kamikawa ................... 134/61 |
| 6,186,722 B1 | 2/2001 | Shirai ......................... 414/217 |
| 6,190,459 B1 | 2/2001 | Takeshita et al. ........... 118/715 |
| 6,203,582 B1 | 3/2001 | Berner et al. ............... 29/25.01 |
| 6,216,364 B1 | 4/2001 | Tanaka et al. ................ 34/448 |
| 6,221,781 B1 | 4/2001 | Siefering et al. |
| 6,228,563 B1 | 5/2001 | Starov et al. ............... 430/327 |
| 6,235,634 B1 | 5/2001 | White et al. ................. 438/680 |
| 6,239,038 B1 | 5/2001 | Wen .......................... 438/745 |
| 6,241,825 B1 | 6/2001 | Wytman ...................... 118/733 |
| 6,242,165 B1 | 6/2001 | Vaartstra ..................... 430/329 |
| 6,244,121 B1 | 6/2001 | Hunter ...................... 73/865.9 |
| 6,251,250 B1 | 6/2001 | Keigler ........................ 205/89 |
| 6,264,752 B1 | 7/2001 | Curtis et al. |
| 6,264,753 B1 | 7/2001 | Chao et al. |
| 6,277,753 B1 | 8/2001 | Mullee et al. .............. 438/692 |
| 6,286,231 B1 | 9/2001 | Bergman et al. ............. 34/410 |
| 6,305,677 B1 | 10/2001 | Lenz ........................... 269/13 |
| 6,306,564 B1 | 10/2001 | Mullee |
| 6,319,858 B1 | 11/2001 | Lee et al. .................... 438/787 |
| 6,333,268 B1 | 12/2001 | Starov et al. |
| 6,334,266 B1 | 1/2002 | Moritz et al. ................. 34/337 |
| 6,344,174 B1 | 2/2002 | Miller et al. ................... 422/98 |
| 6,355,072 B1 | 3/2002 | Racette et al. ................. 8/142 |
| 6,363,292 B1 | 3/2002 | McLoughlin |
| 6,388,317 B1 | 5/2002 | Reese ......................... 257/713 |
| 6,389,677 B1 | 5/2002 | Lenz ........................... 29/559 |
| 6,406,782 B2 | 6/2002 | Johnson et al. |
| 6,418,956 B1 | 7/2002 | Bloom ........................ 137/14 |
| 6,436,824 B1 | 8/2002 | Chooi et al. ................. 438/687 |
| 6,454,519 B1 | 9/2002 | Toshima et al. ............. 414/805 |
| 6,454,945 B1 | 9/2002 | Weigl et al. ................. 210/634 |
| 6,464,790 B1 | 10/2002 | Sherstinsky et al. ........ 118/715 |
| 6,465,403 B1 | 10/2002 | Skee |
| 6,497,239 B2 | 12/2002 | Farmer et al. |
| 6,508,259 B1 | 1/2003 | Tseronis et al. ............. 134/105 |
| 6,509,141 B2 | 1/2003 | Mullee |
| 6,521,466 B1 | 2/2003 | Castrucci ........................ 438/5 |
| 6,532,772 B1 * | 3/2003 | Robinson ................... 65/182.2 |
| 6,541,278 B2 | 4/2003 | Morita et al. ................... 438/3 |
| 6,546,946 B2 | 4/2003 | Dunmire .................. 137/15.18 |
| 6,550,484 B1 | 4/2003 | Gopinath et al. ............ 134/1.2 |
| 6,558,475 B1 | 5/2003 | Jur et al. ...................... 134/21 |
| 6,561,213 B2 | 5/2003 | Wang et al. ................. 137/263 |
| 6,561,220 B2 | 5/2003 | McCullough et al. .. 137/565.12 |
| 6,561,481 B1 | 5/2003 | Filonczuk ............... 251/129.12 |
| 6,561,767 B2 | 5/2003 | Biberger et al. ............... 417/53 |
| 6,564,826 B2 | 5/2003 | Shen .................... 137/505.18 |
| 6,596,093 B2 | 7/2003 | DeYoung et al. |
| 6,612,317 B2 | 9/2003 | Costantini et al. |
| 6,613,105 B1 * | 9/2003 | Moore ....................... 29/25.01 |
| 6,616,414 B2 | 9/2003 | Yoo et al. |
| 6,635,565 B2 | 10/2003 | Wu et al. |
| 6,641,678 B2 | 11/2003 | DeYoung et al. |
| 6,642,140 B1 * | 11/2003 | Moore ....................... 438/631 |
| 6,722,642 B1 | 4/2004 | Sutton et al. |
| 6,736,149 B2 | 5/2004 | Biberger et al. |
| 6,764,212 B1 | 7/2004 | Nitta et al. ................. 366/114 |
| 6,764,552 B1 | 7/2004 | Joyce et al. |
| 6,805,801 B1 | 10/2004 | Humayun et al. |
| 6,815,922 B2 | 11/2004 | Yoo et al. |
| 6,851,148 B2 | 2/2005 | Preston et al. |
| 6,874,513 B2 | 4/2005 | Yamagata et al. |
| 6,921,456 B2 | 7/2005 | Biberger et al. |
| 6,966,967 B2 | 11/2005 | Curry et al. |
| 2001/0050096 A1 | 12/2001 | Costantini et al. |
| 2002/0001929 A1 | 1/2002 | Biberger et al. ............. 438/584 |
| 2002/0046707 A1 | 4/2002 | Biberger et al. |
| 2002/0189543 A1 | 12/2002 | Biberger et al. |
| 2003/0005948 A1 | 1/2003 | Matsuno et al. |
| 2003/0036023 A1 | 2/2003 | Moreau et al. |
| 2003/0051741 A1 | 3/2003 | DeSimone et al. |
| 2003/0161734 A1 | 8/2003 | Kim |
| 2003/0196679 A1 | 10/2003 | Cotte et al. |
| 2003/0205510 A1 | 11/2003 | Jackson ....................... 210/86 |
| 2004/0020518 A1 | 2/2004 | DeYoung et al. ............. 134/30 |
| 2004/0134515 A1 | 7/2004 | Castrucci |
| 2004/0157463 A1 | 8/2004 | Jones |
| 2004/0213676 A1 | 10/2004 | Phillips et al. |
| 2005/0014370 A1 | 1/2005 | Jones |
| 2005/0026547 A1 | 2/2005 | Moore et al. |
| 2005/0111987 A1 | 5/2005 | Yoo et al. |
| 2005/0141998 A1 | 6/2005 | Yoo et al. |
| 2005/0158178 A1 | 7/2005 | Yoo et al. |
| 2005/0191184 A1 | 9/2005 | Vinson, Jr. |
| 2006/0130966 A1 | 6/2006 | Babic et al. |

FOREIGN PATENT DOCUMENTS

| | | |
|---|---|---|
| CN | 1399790 A | 2/2003 |
| DE | 36 08 783 A1 | 9/1987 |
| DE | 39 04 514 C2 | 8/1990 |
| DE | 40 04 111 C2 | 8/1990 |
| DE | 39 06 724 C2 | 9/1990 |
| DE | 39 06 735 C2 | 9/1990 |

| | | |
|---|---|---|
| DE | 39 06 737 A1 | 9/1990 |
| DE | 44 29 470 A1 | 3/1995 |
| DE | 43 44 021 A1 | 6/1995 |
| DE | 198 60 084 A1 | 7/2000 |
| EP | 0 244 951 A2 | 11/1987 |
| EP | 0272 141 A2 | 6/1988 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 453 867 A1 | 10/1991 |
| EP | 0 518 653 B1 | 12/1992 |
| EP | 0 536 752 A2 | 4/1993 |
| EP | 0 572 913 A1 | 12/1993 |
| EP | 0 587 168 A1 | 3/1994 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 743 379 A1 | 11/1996 |
| EP | 0 822 583 A2 | 2/1998 |
| EP | 0 829 312 A2 | 3/1998 |
| EP | 0 836 895 A2 | 4/1998 |
| EP | 0 903 775 A2 | 3/1999 |
| FR | 1499491 | 9/1967 |
| GB | 2 003 975 | 3/1979 |
| GB | 2 193 482 | 2/1988 |
| JP | 56-142629 | 11/1981 |
| JP | 60-192333 | 9/1985 |
| JP | 60-2348479 | 11/1985 |
| JP | 60-246635 | 12/1985 |
| JP | 61-231166 | 10/1986 |
| JP | 62-111442 | 5/1987 |
| JP | 62-125619 | 6/1987 |
| JP | 63-179530 | 7/1988 |
| JP | 63-256326 | 10/1988 |
| JP | 63-303059 | 12/1988 |
| JP | 1-045131 | 2/1989 |
| JP | 1-246835 | 10/1989 |
| JP | 2-148841 | 6/1990 |
| JP | 2-209729 | 8/1990 |
| JP | 2-304941 | 12/1990 |
| JP | 4-17333 | 1/1992 |
| JP | 4-284648 | 10/1992 |
| JP | 40 5283511 A | 10/1993 |
| JP | 7-142333 | 6/1995 |
| JP | 7-283104 | 10/1995 |
| JP | 8-186140 A | 7/1996 |
| JP | 8186140 A | 7/1996 |
| JP | 8-222508 A | 8/1996 |
| JP | 8-252549 | 10/1996 |
| JP | 9-43857 | 2/1997 |
| JP | 10-144757 A | 5/1998 |
| JP | 10-260537 | 9/1998 |
| JP | 10335408 A | 12/1998 |
| JP | 11-200035 | 7/1999 |
| JP | 11-274132 | 10/1999 |
| JP | 2000-106358 | 4/2000 |
| JP | 2001-77074 | 3/2001 |
| WO | WO 87/07309 | 12/1987 |
| WO | WO 90/06189 | 6/1990 |
| WO | WO 90/13675 | 11/1990 |
| WO | WO 91/12629 A | 8/1991 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/18603 A | 4/1999 |
| WO | WO 99/49998 | 10/1999 |
| WO | WO 00/36635 | 6/2000 |
| WO | WO 00/73241 A1 | 12/2000 |
| WO | WO 01/10733 A1 | 2/2001 |
| WO | WO 01/22016 A1 | 3/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A2 | 12/2001 |
| WO | WO 02/09147 A2 | 1/2002 |
| WO | WO 02/09894 A2 | 2/2002 |
| WO | WO 02/11191 A2 | 2/2002 |
| WO | WO 02/16051 A2 | 2/2002 |
| WO | WO 03/030219 A2 | 10/2003 |

OTHER PUBLICATIONS

"Los Almos National Laboratory," Solid State Technology, pp. S10 & S14, Oct. 1998.

"Supercritical Carbon Dioxide Resist Remover, SCORR, the Path to Least Photoresistance," Los Alamos National Laboratory, 1998.

Guan, Z. et al., "Fluorocarbon-Based Heterophase Polymeric Materials. 1. Block Copolymer Surfactants for Carbon Dioxide Applications," Macromolecules, vol. 27, 1994, pp. 5527-5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872-874.

Ziger, D.H. et al., "Compressed Fluid Technology: Application to RIE Developed Resists," AIChE Journal, vol. 33, No. 10, Oct. 1987, pp. 1585-1591.

Kirk-Othmer, "Alcohol Fuels to Toxicology," Encyclopedia of Chemical Terminology, 3rd ed., Supplement Volume, New York: John Wiley & Sons, 1984, pp. 872-893.

"Cleaning with Supercritical $CO_2$,"NASA Tech Briefs, MFS-29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Takahashi, D., "Los Alamos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Jackson, K. et al., "Surfactants and Micromulsions in Supercritical Fluids," Supercritical Fluid Cleaning. Noyes Publications, Westwood, NJ, pp. 87-120, Spring 1998.

Kryszewski, M., "Production of Metal and Semiconductor Nanoparticles in Polymer Systems," Polimery, pp. 65-73, Feb. 1998.

Bakker, G.L. et al., "Surface Cleaning and Carbonaceous Film Removal Using High Pressure, High Temperature Water, and Water/C02 Mixtures," Electrochem. Soc, vol. 145, No. 1, pp. 284-291, Jan. 98.

Ober, C.K. et al., "Imaging Polymers with Supercritical Carbon Dioxide," Advanced Materials, vol. 9, No. 13, 1039-1043, Nov. 3, 1997.

Russick, E.M. et al., "Supercritical Carbon Dioxide Extraction of Solvent from Micro-machined Structures." Supercritical Fluids Extraction and Pollution Prevention, ACS Symposium Series, vol. 670, pp. 255-269, Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Wai, C.M., "Supercritical Fluid Extraction: Metals as Complexes," Journal of Chromatography A, vol. 785, pp. 369-383, Oct. 17, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Tomioka Y., et al., "Decomposition of Tetramethylammonium (TMA) in a Positive Photo-resist Developer by Supercritical Water,"

Abstracts of Papers 214th ACS Natl Meeting, American Chemical Society, Abstract No. 108, Sep. 7, 1997.

Klein, H. et al., "Cyclic Organic Carbonates Serve as Solvents and Reactive Diluents," Coatings World, pp. 38-40, May 1997.

Bühler, J. et al., "Linear Array of Complementary Metal Oxide Semiconductor Double-Pass Metal Micro-mirrors," Opt. Eng., vol. 36, No. 5, pp. 1391-1398, May 1997.

Jo, M.H. et al., Evaluation of SIO2 Aerogel Thin Flim with Ultra Low Dielectric Constant as an Intermetal Dielectric, Microelectronic Engineering, vol. 33, pp. 343-348, Jan. 1997.

McClain, J.B. et al., "Design of Nonionic Surfactants for Supercritical Carbon Dioxide," Science, vol. 274, Dec. 20, 1996. pp. 2049-2052.

Znaidi, L. et al., "Batch and Semi-Continuous Synthesis of Magnesium Oxide Powders from Hydrolysis and Supercritical Treatment of Mg(OCH3)2," Materials Research Bulletin, vol. 31, No. 12, pp. 1527-1335, Dec. 1996.

Tadros, M.E., "Synthesis of Titanium Dioxide Particles in Supercritical CO2," J. Supercritical Fluids, vol. 9, pp. 172-176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gabor, A, et al., "Block and Random Copolymer resists Designed for 193 nm Lithography and Environmentally Friendly Supercritical CO2 Development,", SPIE, vol. 2724, pp. 410-417, Jun. 1996.

Schimek, G. L. et al., "Supercritical Ammonia Synthesis and Characterization of Four New Alkali Metal Silver Antimony Sulfides . . . ," J. Solid State Chemistry, vol. 123 pp. 277-284, May 1996.

Gallagher-Wetmore, P. et al., "Supercritical Fluid Processing: Opportunities for New Resist Materials and Processes," SPIE, vol. 2725, pp. 289-299, Apr. 1996.

Papathomas, K.I. et al., "Debonding of Photoresists by Organic Solvents," J. Applied Polymer Science, vol. 59, pp. 2029-2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991-1994.

Gloyna, E.F. et al., "Supercritical Water Oxidation Research and Development Update," Environmental Progress, vol. 14, No. 3. pp. 182-192, Aug. 1995.

Gallagher-Wetmore, P. et al., "Supercritical Fluid Processing: A New Dry Technique for Photoresist Developing," SPIE vol. 2438, pp. 694-708, Jun. 1995.

Gabor, A. H. et al., "Silicon-Containing Block Copolymer Resist Materials," Microelectronics Technology—Polymers for Advanced Imaging and Packaging, ACS Symposium Series, vol. 614, pp. 281-298, Apr. 1995.

Tsiartas, P.C. et al., "Effect of Molecular weight Distribution on the Dissolution Properties of Novolac Blends," SPIE, vol. 2438, pp. 264-271, Jun. 1995.

Allen, R.D. et al., "Performance Properties of Near-monodisperse Novolak Resins," SPIE, vol. 2438, pp. 250-260, Jun. 1995.

Wood, P.T. et al., "Synthesis of New Channeled Structures in Supercritical Amines . . . ," Inorg. Chem., vol. 33, pp. 1556-1558, 1994.

Jerome, J.E. et al., "Synthesis of New Low-Dimensional Quaternary Compounds . . . ," Inorg. Chem, vol. 33, pp. 1733-1734, 1994.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Bok, E, et al., "Supercritical Fluids for Single Wafer Cleaning," Solid State Technology, pp. 117-120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019-1022, 1992.

Hansen, B.N. et al., "Supercritical Fluid Transport—Chemical Deposition of Films," Chem. Mater., vol. 4, No. 4, pp. 749-752, 1992.

Page, S.H. et al., "Predictability and Effect of Phase Behavior of CO2/ Propylene Carbonate in Supercritical Fluid Chromatography," J. Microcol, vol. 3, No. 4, pp. 355-369, 1991.

Brokamp, T. et al., "Synthese und Kristallstruktur Eines Gemischtvalenten Lithium-Tantalnitrids Li2Ta3N5," J. Alloys and Compounds, vol. 176. pp. 47-60, 1991.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

"Final Report on the Safety Assessment of Propylene Carbonate", J. American College of Toxicology, vol. 6, No. 1, pp. 23-51, 1987.

"Porous Xerogel Films as Ultra-Low Permittivity Dielectrics for ULSI Interconnect Applications", Materials Research Society, pp. 463-469, 1997.

Kawakami et al, "A Super Low-k (k=1.1) Silica Aerogel Film Using Supercritical Drying Technique", IEEE, pp. 143-145, 2000.

R.F. Reidy, "Effects of Supercritical Processing on Ultra Low-K Films", Texas Advanced Technology Program, Texas Instruments, and the Texas Academy of Mathematics and Science.

Anthony Muscat, "Backend Processing Using Supercritical CO2", University of Arizona.

D. Goldfarb et al., "Aqueous-based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water-Rinsed Resist Systems", J. Vacuum Sci. Tech. B 18 (6), 3308 (2000).

N. Sundararajan et al., "Supercritical CO2 Processing for Submicron Imaging of Fluoropolymers", Chem. Mater. 12, 41 (2000).

* cited by examiner

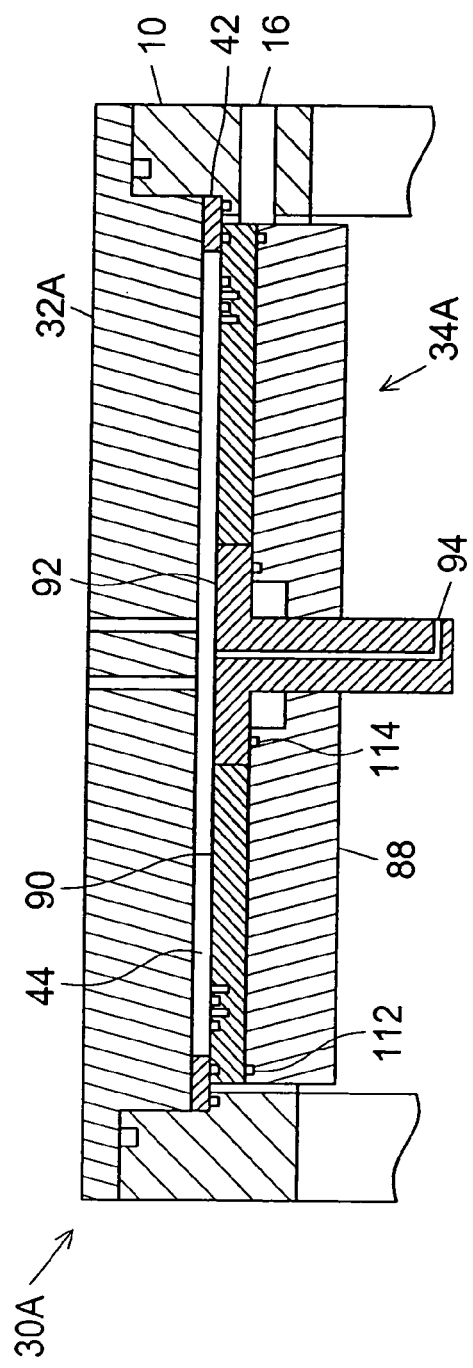
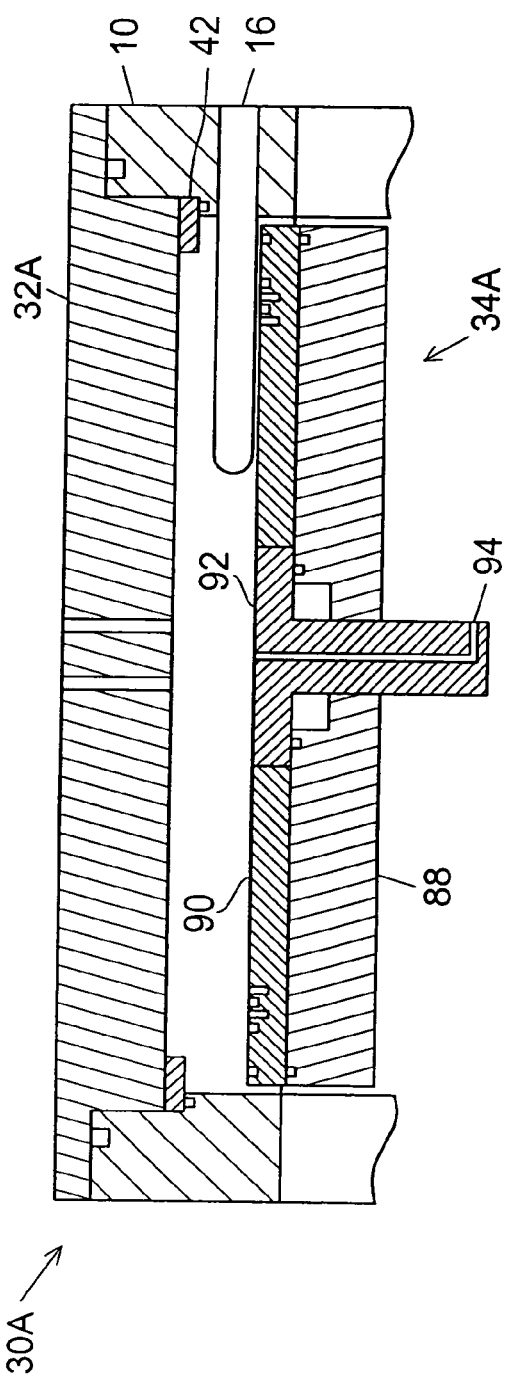
FIG. 8A
FIG. 8B

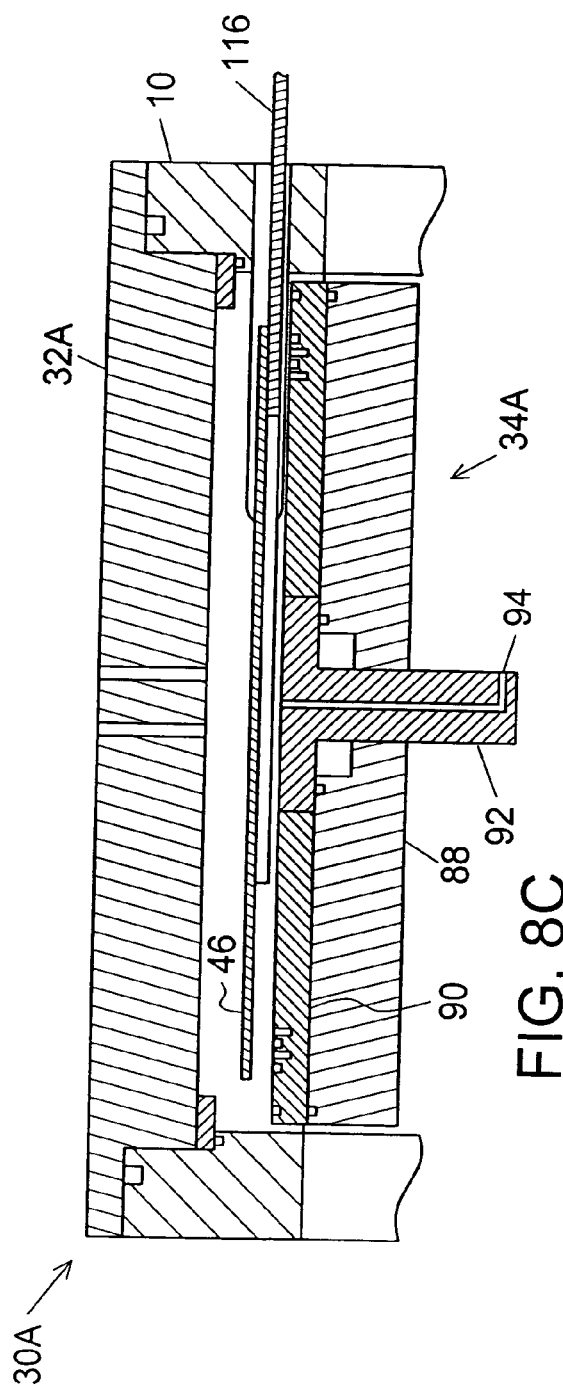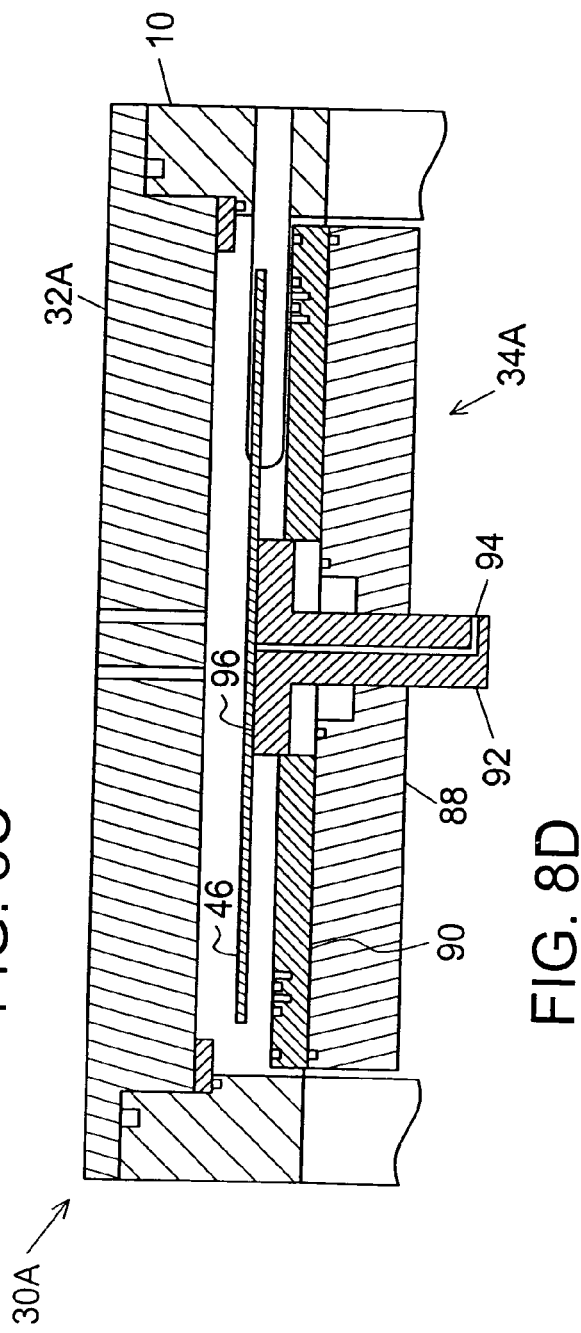

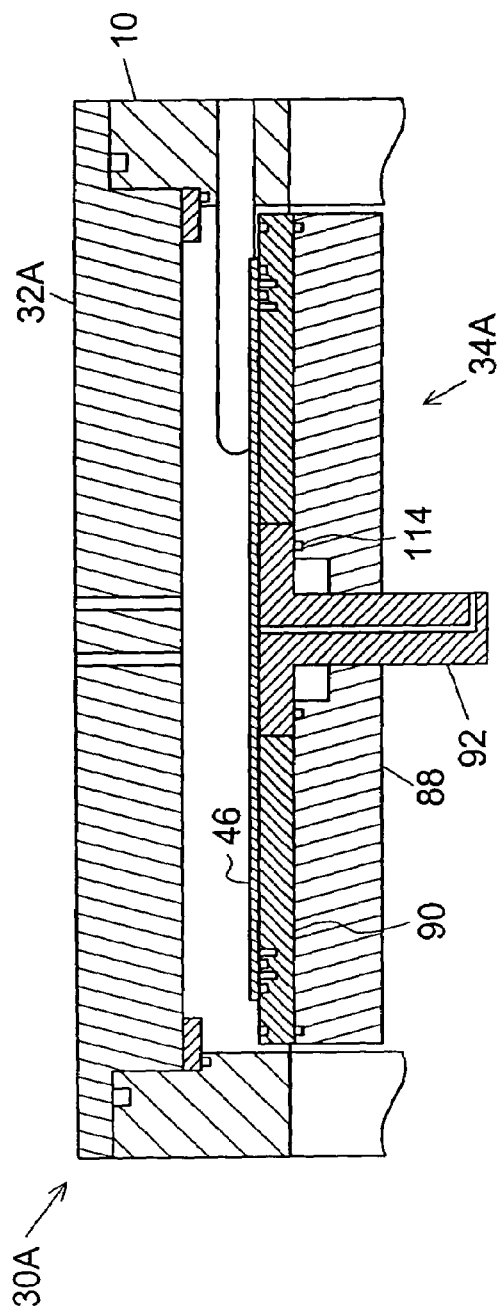
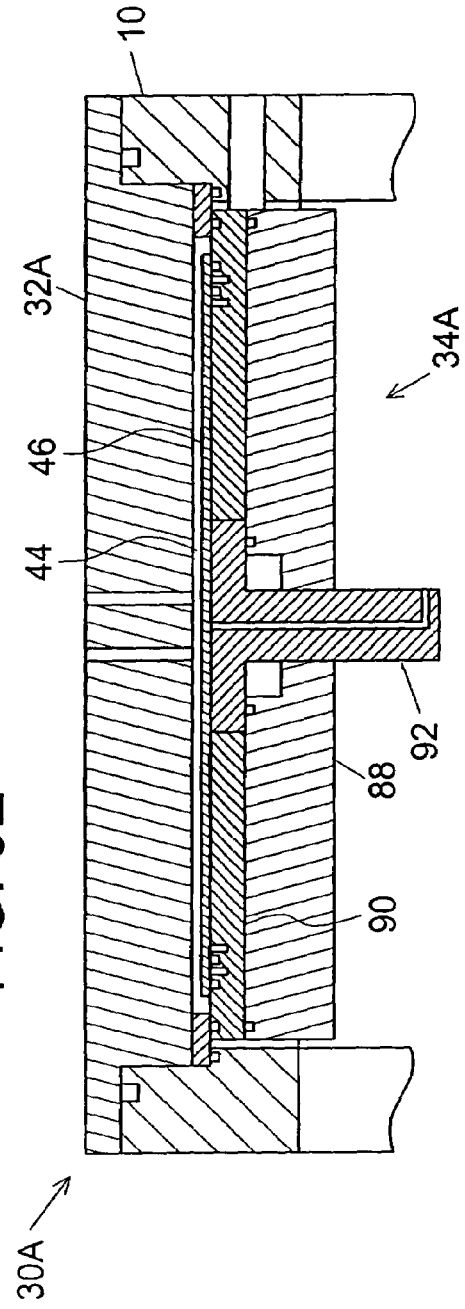
FIG. 8E
FIG. 8F

HIGH PRESSURE PROCESSING CHAMBER FOR SEMICONDUCTOR SUBSTRATE

RELATED APPLICATIONS

This application is a continuation application of the U.S. patent application Ser. No. 09/912,844, filed on Jul. 24, 2001 now U.S. Pat. No. 6,921,456, and titled "HIGH PRESSURE PROCESSING CHAMBER FOR SEMICONDUCTOR SUBSTRATE," which claims priority from U.S. Provisional Patent Application Ser. No. 60/220,883, filed on Jul. 26, 2000, and from U.S. Provisional Patent Application Ser. No. 60/283,132, filed on Apr. 10, 2001, and titled "SUPERCRITICAL PROCESSING CHAMBER FOR PROCESSING SEMICONDUCTOR WAFER. The U.S. patent application Ser. No. 09/912,844, filed on Jul. 24, 2001, and titled "HIGH PRESSURE PROCESSING CHAMBER FOR SEMICONDUCTOR SUBSTRATE," the U.S. Provisional Patent Application Ser. No. 60/220,883, filed on Jul. 26, 2000, and the U.S. Provisional Patent Application Ser. No. 60/283,132, filed on Apr. 10, 2001, and titled "SUPERCRITICAL PROCESSING CHAMBER FOR PROCESSING SEMICONDUCTOR WAFER" are all incorporated by reference.

FIELD OF THE INVENTION

This invention relates to the field of high pressure processing. More particularly, this invention relates to the field of high pressure processing of a semiconductor substrate.

BACKGROUND OF THE INVENTION

Processing of semiconductor substrates presents unique problems not associated with processing of other workpieces. Typically, the semiconductor processing begins with a silicon wafer. The semiconductor processing starts with doping of the silicon wafer to generate transistor semiconductors. Next, the semiconductor processing continues with deposition of metal and dielectric layers interspersed with etching of lines and vias to produce transistor contacts and interconnect structures. Ultimately in the semiconductor processing, the transistor semiconductors, the transistor contacts, and the interconnects form integrated circuits.

A critical processing requirement for the processing of the semiconductor substrate is cleanliness. Much of semiconductor processing takes place in vacuum, which is an inherently clean environment. Other semiconductor processing takes place in a wet process at atmospheric pressure, which because of a rinsing nature of the wet process is an inherently clean process. For example, removal of photoresist and photoresist residue subsequent to etching of the lines and the vias uses plasma ashing, a vacuum process, followed by stripping in a stripper bath, a wet process.

Other critical processing requirements for the processing of the semiconductor substrates include throughput and reliability. Production processing of the semiconductor substrates takes place in a semiconductor fabrication facility. The semiconductor fabrication facility requires a large capital outlay for processing equipment, for the facility itself, and for a staff to run it. In order to recoup these expenses and generate a sufficient income from the facility, the processing equipment requires a throughput of a sufficient number of the wafers in a period of time. The processing equipment must also promote a reliable process in order to ensure continued revenue from the facility.

Until recently, the plasma ashing and the stripper bath was found sufficient for the removal of the photoresist and the photoresist residue in the semiconductor processing. However, recent advancements for the integrated circuits include etch feature critical dimensions below dimensions with sufficient structure to withstand the stripper bath and low dielectric constant materials which cannot withstand an oxygen environment of the plasma ashing.

Recently, interest has developed in replacing the plasma ashing and the stripper bath for the removal of the photoresist and the photoresist residue with a supercritical process. However, high pressure processing chambers of existing supercritical processing systems are not appropriate to meet the unique needs of the semiconductor processing requirements.

What is needed is a high pressure processing chamber for semiconductor processing which meets cleanliness requirements of the semiconductor processing.

What is needed is a high pressure processing chamber for semiconductor processing which meets throughput requirements of the semiconductor processing.

What is needed is a high pressure processing chamber for semiconductor processing which meets reliability requirements of the semiconductor processing.

SUMMARY OF THE INVENTION

The present invention is a high pressure chamber for processing of a semiconductor substrate. The high pressure chamber comprises a chamber housing, a platen, and a mechanical drive mechanism. The chamber housing comprises a first sealing surface. The platen comprises a region for holding the semiconductor substrate and a second sealing surface. The mechanical drive mechanism couples the platen to the chamber housing. In operation, the mechanical drive mechanism separates the platen from the chamber housing for loading of the semiconductor substrate. In further operation, the mechanical drive mechanism causes the second sealing surface of the platen and the first sealing surface of the chamber housing to form a high pressure processing chamber around the semiconductor substrate.

BRIEF DESCRIPTION OF THE DRAWINGS

FIGS. 8A through 8F illustrate the pressure chamber frame, the spacer/injection ring, and a wafer platen assembly of the present invention.

DETAILED DESCRIPTION OF THE PREFERRED EMBODIMENT

The preferred pressure chamber of the present invention is preferably used for supercritical processing of a semiconductor wafer. Preferably, the preferred pressure chamber forms part of a supercritical processing module. Preferably, the supercritical processing module is used to remove photoresist from the semiconductor wafer. Alternatively, the supercritical processing module is used for other supercritical processing of the semiconductor wafer, such as photoresist development.

Figure 1:
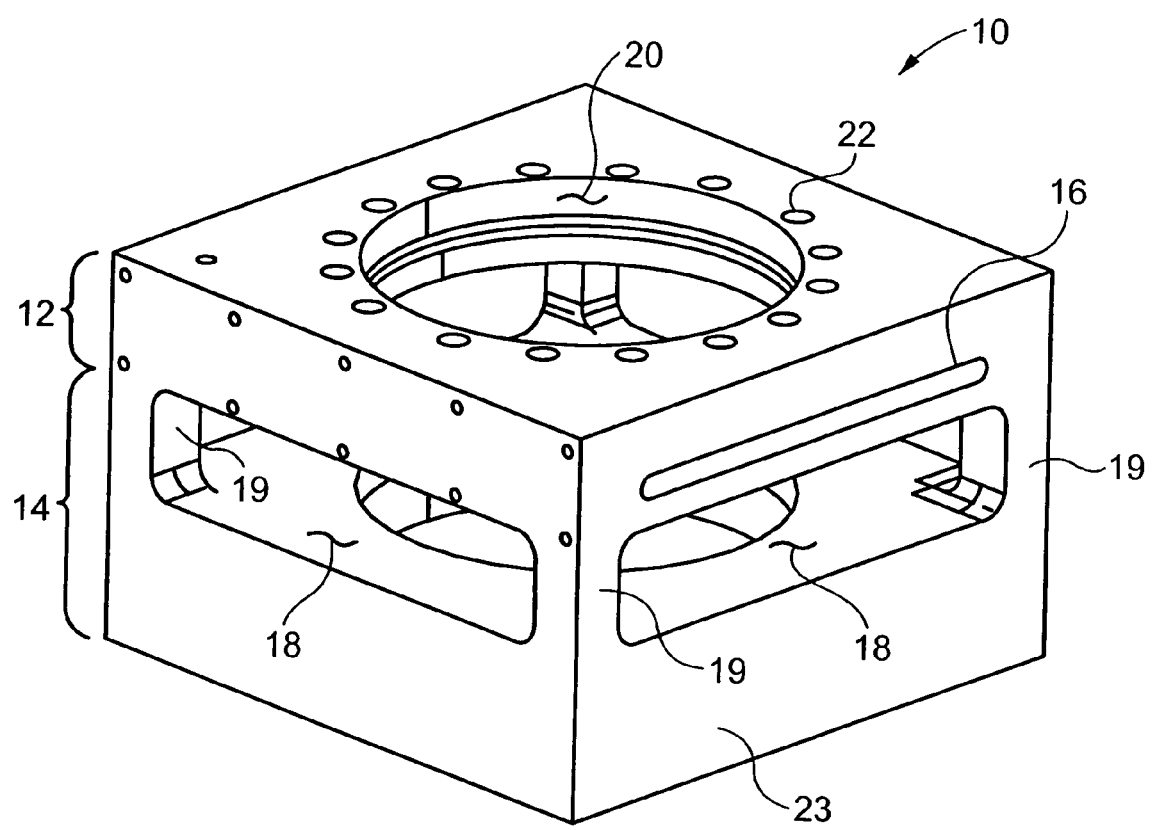
FIG. 1 illustrates a pressure chamber frame of the present invention.

A pressure chamber frame of the present invention is illustrated in FIG. 1. The pressure chamber frame 10 includes a pressure chamber housing portion 12, an opening/closing housing portion 14, a wafer slit 16, windows 18, posts 19, a top opening 20, and top bolt holes 22. The wafer slit 16 is preferably sized for a 300 mm wafer. Alternatively, the wafer slit 16 is sized for a larger or a smaller wafer. Further alternatively, the wafer slit 16 is sized for a semiconductor substrate other than a wafer, such as a puck.

The opening/closing housing portion 14 of the pressure chamber frame 10 includes the windows 18, which provide access for assembly and disassembly of the preferred pressure chamber. Preferably, there are four of the windows 18, which are located on sides of the pressure chamber frame 10. Preferably, each of the windows 18 are framed on their sides by two of the posts 19, on their top by the pressure chamber housing portion 12, and on their bottom by a base 23. The bolt holes 22 of the pressure chamber housing portion 12 are for bolting a top lid to the pressure chamber frame 10.

Prior to describing the preferred pressure chamber of the present invention, a first alternative pressure chambers is described in order to more simply introduce aspects of the present invention.

Figure 2:
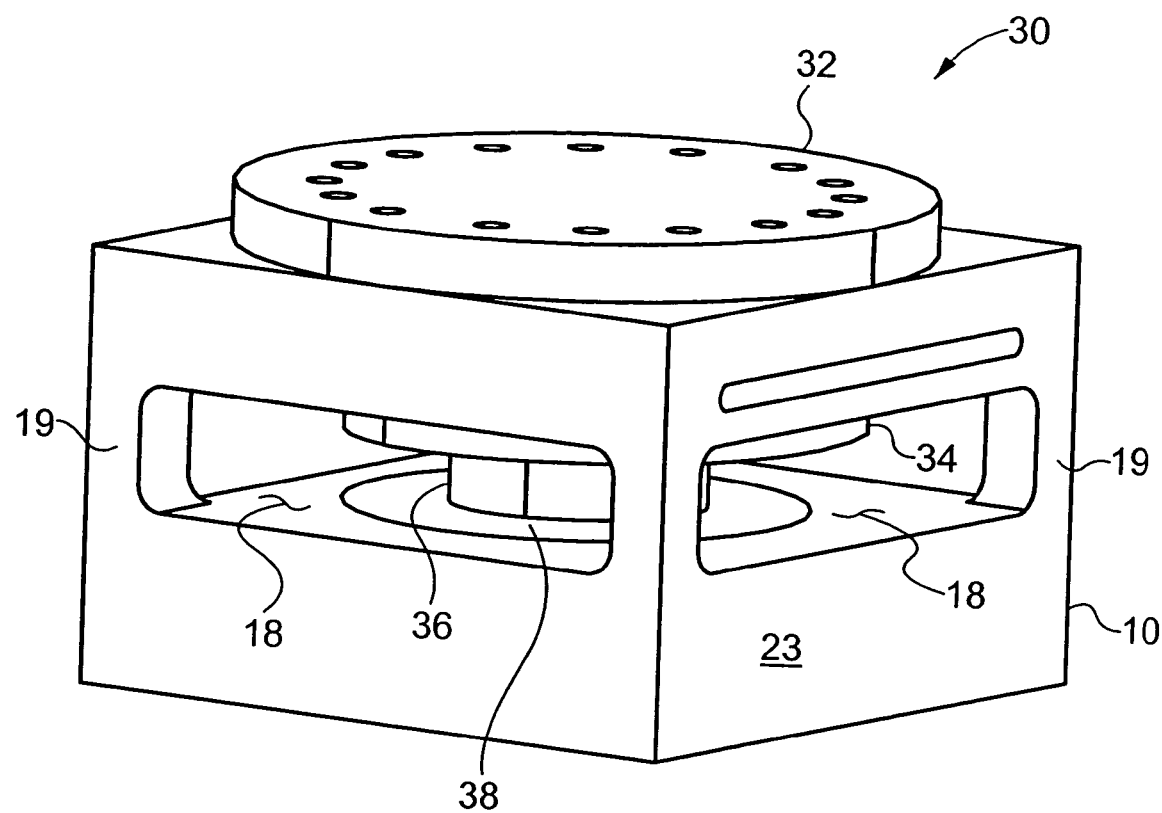
FIG. 2 illustrates a first alternative pressure chamber of the present invention.

The first alternative pressure chamber of the present invention is illustrated in FIG. 2. The first alternative pressure chamber 30 includes the pressure chamber frame 10, the top lid 32, a wafer platen 34, a cylinder 36, and a sealing plate 38. The top lid 32 is coupled to the pressure chamber frame 10, preferably by bolts (not shown). The wafer platen 34 is coupled to the cylinder 36. The cylinder 36 is coupled to a piston (not shown). The sealing plate 38 seals the piston from atmosphere.

It will be readily apparent to one skilled in the art that fasteners couple the wafer platen 34 to the cylinder 36, couple the cylinder 36 to the piston, and couple the sealing plate 38 to the pressure chamber frame 10. Further, it will be readily apparent to one skilled in the art that the bolts which preferably couple the top lid 32 to the pressure chamber frame 10 can be replaced by an other fastener, such as by screws or by threading the pressure chamber frame 10 and the top lid 32.

Figure 3:
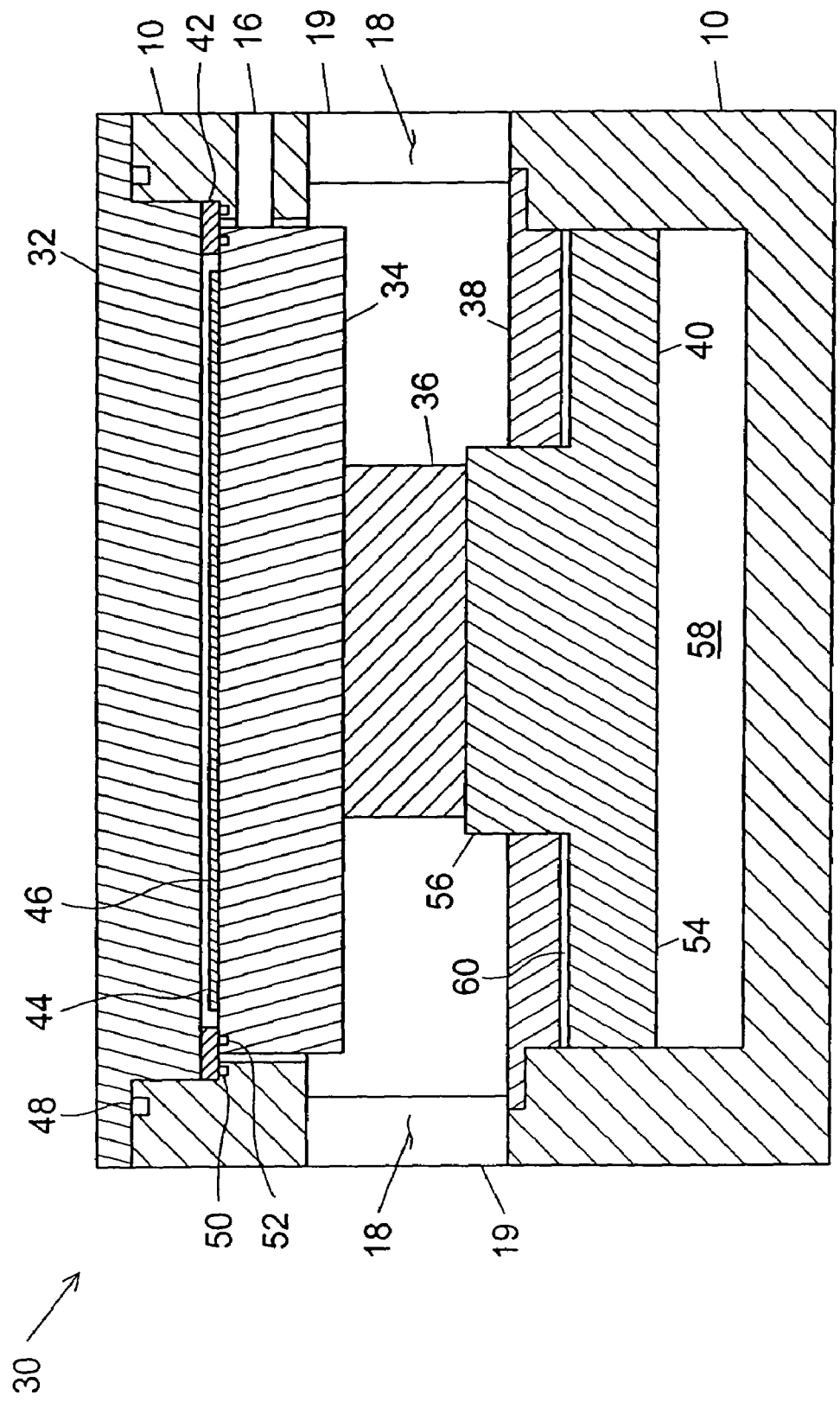
FIG. 3 illustrates a cross-section of the first alternative pressure chamber of the present invention.

A cross-sectional view of the first alternative pressure chamber 30 in a closed configuration is illustrated in FIG. 3. The first alternative pressure chamber 30 includes the pressure chamber frame 10, the top lid 32, the wafer platen 34, the cylinder 36, the sealing plate 38, the piston 40, and a spacer/injection ring 42. Preferably, the pressure chamber frame 10, the top lid 32, the wafer platen 34, the cylinder 36, the sealing plate 38, the piston 40, and the spacer/injection ring 42 comprise stainless steel. The spacer/injection ring 42, the top lid 32, and the wafer platen 34 form a wafer cavity 44. The wafer cavity 44 is preferably sealed with first, second, and third o-rings (not shown) located in first, second, and third o-ring grooves, 48, 50, and 52. The pressure chamber frame 10 and the sealing plate 38 enclose a piston body 54 leaving a piston neck 56 extending through the sealing plate 38. The piston neck 56 couples to the cylinder 36, which in turn couples to the wafer platen 34.

The pressure chamber frame 10 and the piston body 54 form a hydraulic cavity 58 below the piston body 54. The pressure chamber frame 10, the sealing plate 38, the piston body 54, and the piston neck 56 just above the piston body 54 form a pneumatic cavity 60 between the piston body 54 and the sealing plate 38.

It will be readily apparent to one skilled in the art that a piston seal between the piston body 54 and the pressure chamber frame 10 isolates the hydraulic cavity 58 from the pneumatic cavity 60. Further, it will be readily apparent to one skilled in the art that a neck seal, between the piston neck 56 and the sealing plate 38, and a plate seal, between the sealing plate 38 and the pressure chamber frame 10, isolate the pneumatic cavity 60 from atmosphere. Moreover, it will be readily apparent to one skilled in the art that in operation hydraulic and pneumatic fluid systems, both of which are well known in the art, are coupled to the hydraulic cavity 58 and the pneumatic cavity 60, respectively.

In the supercritical processing, the semiconductor wafer 46 occupies the wafer cavity 44 where a supercritical fluid is preferably used in conjunction with a solvent to remove the photoresist from the semiconductor wafer 46. After the supercritical processing and venting of the wafer cavity 44 to atmospheric pressure, hydraulic fluid within the hydraulic cavity 58 is depressurized while the pneumatic cavity 60 is slightly pressurized with a gas, which moves the piston 40 down. This lowers the wafer platen 34 so that the semiconductor wafer 46 is adjacent to the slit 16. The wafer 46 is then removed through the slit 16. Preferably, the semiconductor wafer is removed by a robot (not shown). Alternatively, the semiconductor wafer 46 is removed by a technician.

A second semiconductor wafer is then loaded through the slit 16 and onto the wafer platen 34. Next, the pneumatic cavity 60 is vented to atmospheric pressure while the hydraulic cavity 58 is pressurized with the hydraulic fluid, which drives the wafer platen 34 into the spacer/injection ring 42, which reforms the wafer cavity 44. The wafer cavity 44 is then pressurized, and the supercritical fluid and the solvent remove the photoresist from the second wafer.

It will be readily apparent to one skilled in the art that during the supercritical processing the hydraulic fluid within the hydraulic cavity 58 must be maintained at an hydraulic pressure which causes an upward force that is greater than a downward force on the wafer platen 34 caused by the supercritical fluid.

Figure 4A:
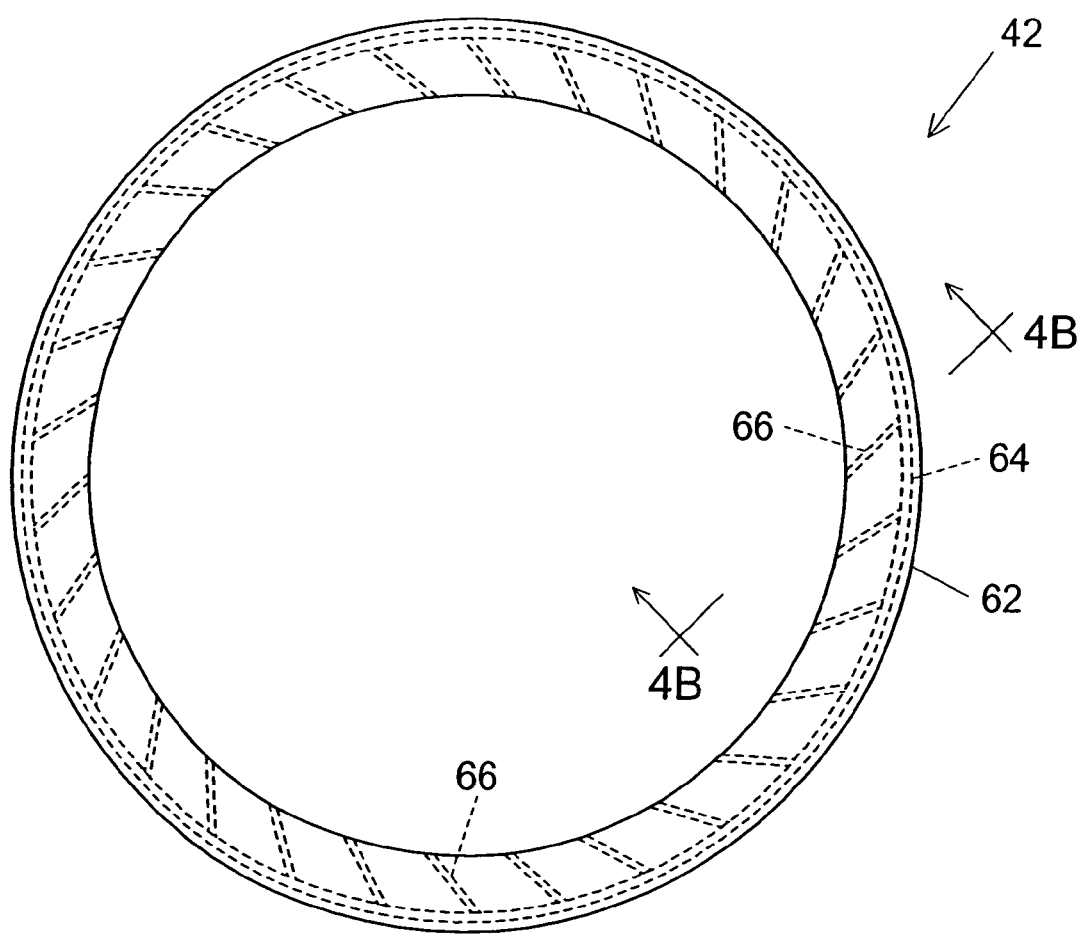
FIGS. 4A and 4B illustrate a spacer/injection ring of the present invention.

The spacer/injection ring 42 of the present invention is further illustrated FIG. 4A. The spacer/injection ring comprises a ring body 62 having an annulus 64 and injection nozzles 66. Preferably, the spacer/injection ring 42 has an inside diameter of slightly greater than 12 inches, which is sized for the 300 mm wafer. Alternatively, the spacer/injection ring 42 has a larger or smaller inside diameter. Preferably, the spacer/injection ring has forty-five of the injection nozzles 66. Alternatively, the spacer/injection ring has more or less of the injection nozzles 66. Preferably, each of the injection nozzles 66 is oriented at 45° to a radius of the inside diameter of the spacer/injection ring 42. Alternatively, the injection nozzles are at a larger or smaller angle. Preferably, the spacer/injection ring 42 has a thickness of 0.200 inches. Alternatively, the spacer/injection ring 42 has a larger or smaller thickness.

Figure 4B:
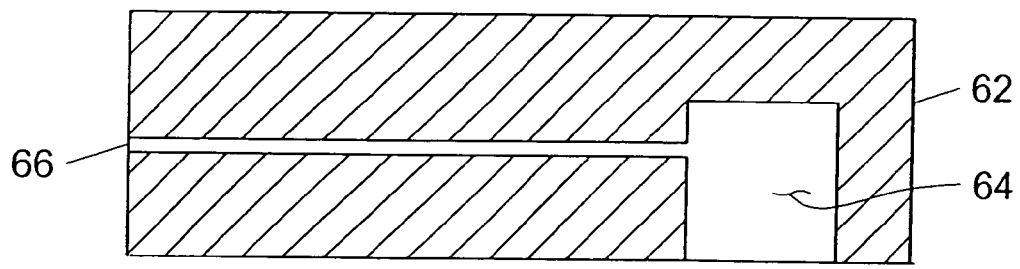

A cross-section of the spacer/injection ring 42 is illustrated in FIG. 4B, showing the ring body 62, the annulus 64, and one of the injection nozzles 66. Preferably, the annulus 64 has a rectangular cross-section having a width of 0.160 inches and a height of 0.110 inches. Preferably, each of the injection nozzles 66 has a diameter of 0.028 inches. The annulus 64 and the injection nozzles 66 of the spacer/injection ring 42 form a passage for the supercritical fluid entering the wafer cavity 44 (FIG. 3). In the supercritical processing, the supercritical fluid first enters the annulus 64, which acts as a reservoir for the supercritical fluid. The supercritical fluid is then injected into the wafer cavity 44 by the injection nozzles 66, which creates a vortex within the wafer cavity 44 (FIG. 3).

Figure 5:
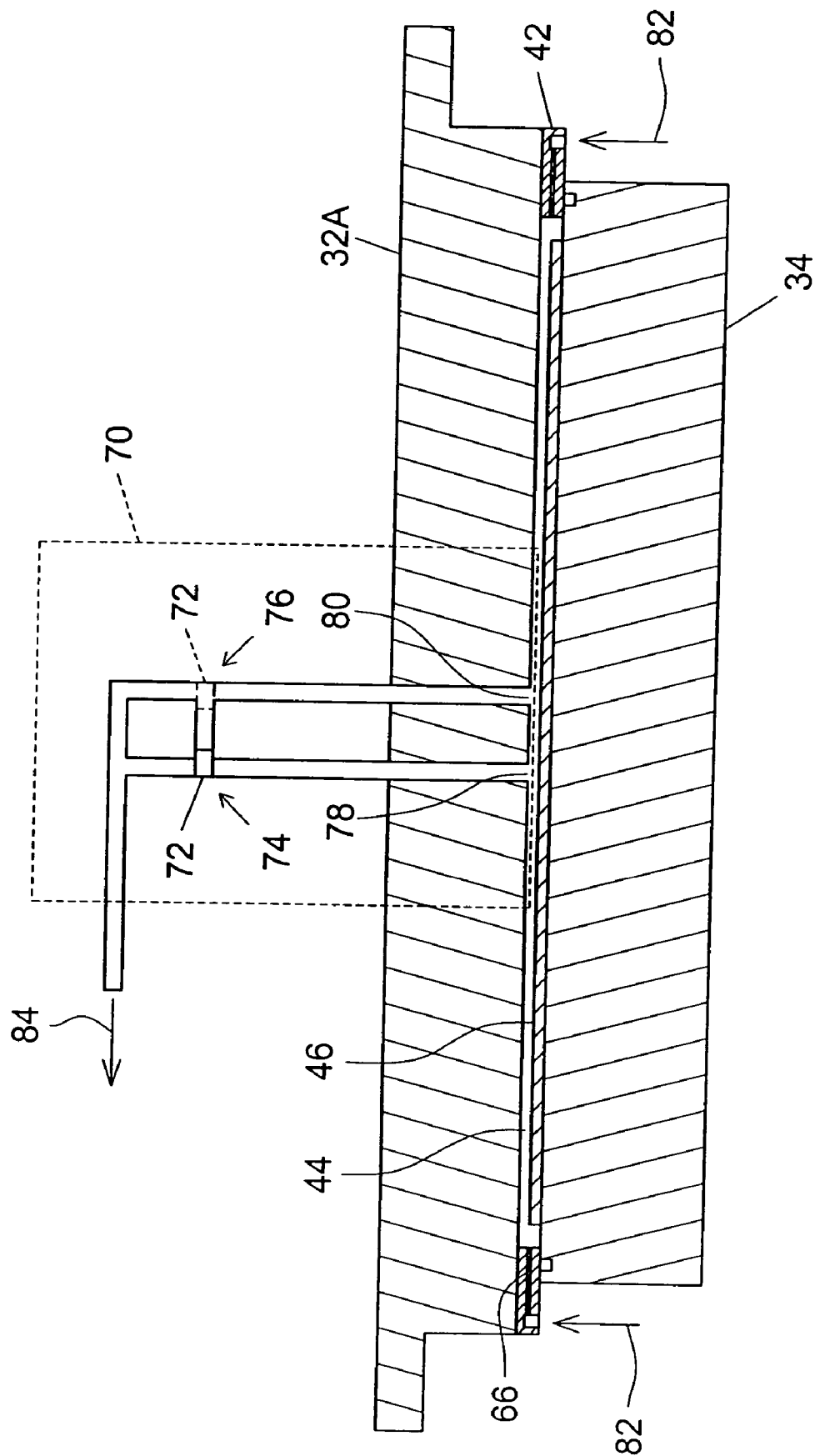
FIG. 5 illustrates a wafer cavity and a two port outlet of the present invention.

The wafer cavity 44 and a two port outlet of the present invention are illustrated in FIG. 5. The wafer cavity 44 formed by an alternative top lid 32A, the wafer platen 34, and the spacer/injection ring 42 is preferably exhausted through the two port outlet 70. The two port outlet 70 includes a shuttle piece 72, which is alternated between a first position 74 and a second position 76. By alternating the shuttle piece 72 between the first and second positions, a center of the vortex formed by the spacer/injection ring 42 will alternate between a first exhaust port 78 and a second exhaust port 80. Preferably, the first and second exhaust ports, 78 and 80, have a diameter of 0.50 inch and have centers separated by a distance of 1.55 inches. Alternatively, the diameter and the distance are larger or smaller depending upon the specific implementation of the present invention.

In operation, incoming supercritical fluid 82 enters the annulus 64 of the spacer/injection ring 42, creates the vortex within the wafer cavity 44, and alternately creates first and second vortex centers proximate to the first and second exhaust ports, 78 and 80, as the shuttle piece moves from the first position 74 to the second position 76. Outgoing supercritical fluid 84 then exits the two port outlet 70. In this way, the supercritical processing of an entire surface of the semiconductor wafer 46 is assured.

It will be readily apparent to one skilled in the art that the injection nozzles 66 of the spacer/injection ring 42 and the two port outlet 70 can be incorporated into a general pressure chamber having ingress and egress for a semiconductor substrate through a gate valve. Further, it will be readily apparent to one skilled in the art that depending upon a particular supercritical process for the semiconductor substrate, the spacer/injection ring 42 could be unneeded since the particular supercritical process does not require the vortex for adequate processing. Moreover, it will be readily apparent to one skilled in the art that the shuttle piece 72 of the two port outlet 70 can be replaced by a more general valve arrangement.

Figure 6:
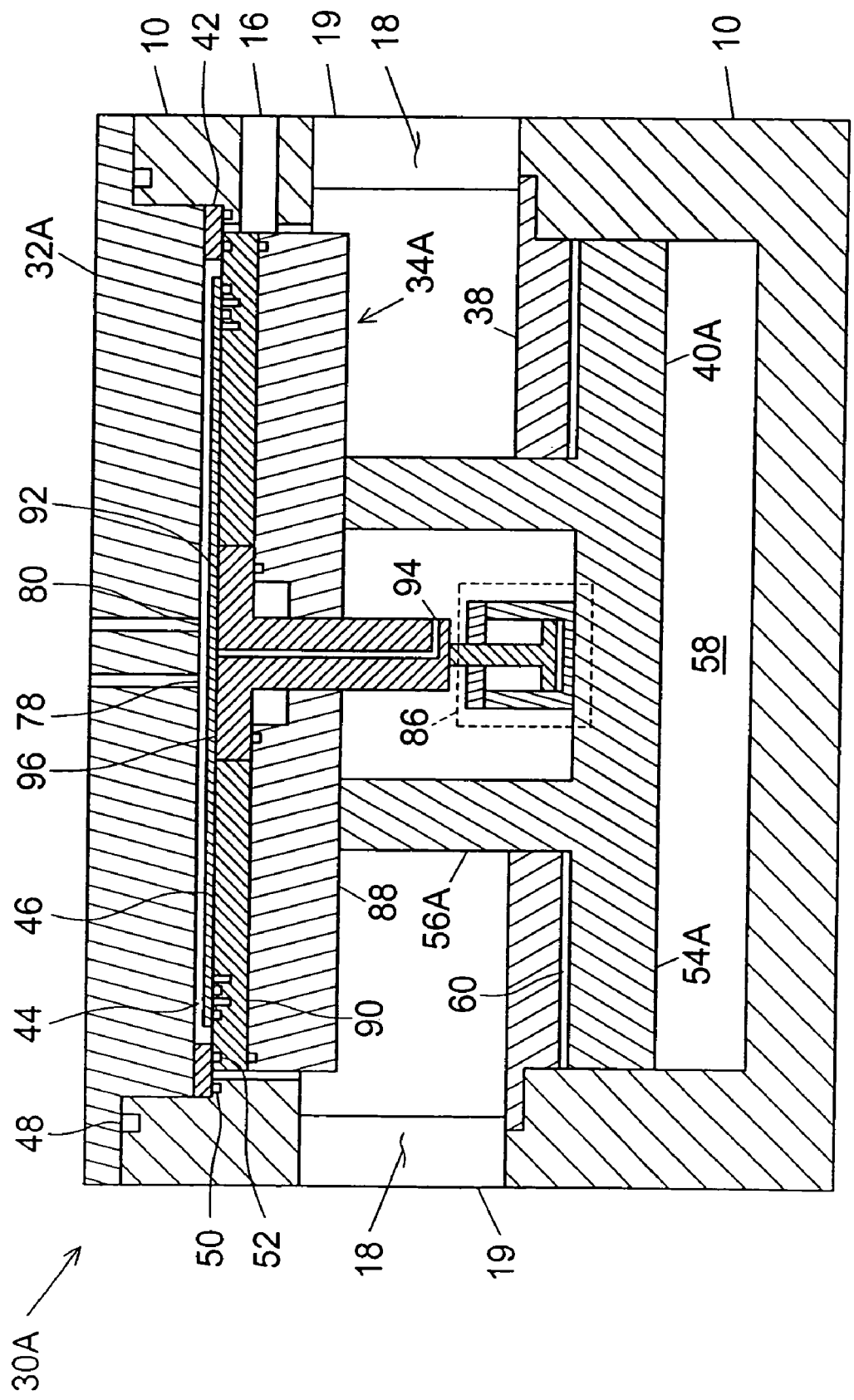
FIG. 6 illustrates the preferred pressure chamber of the present invention.

The preferred pressure chamber of the present invention is illustrated in FIG. 6. The preferred pressure chamber 30A includes the pressure chamber frame 10, the alternative top lid 32A, a wafer platen assembly 34A, the sealing plate 38, an alternative piston 40A, and a pneumatic cylinder 86. The wafer platen assembly 34A includes a lower platen 88, an upper platen 90, and a pedestal 92. The alternative piston 40A includes an alternative piston body 54A and an alternative piston neck 56A.

The alternative piston neck 56A includes a hollow center portion where the pneumatic cylinder 86 couples to the alternative piston 40A. The piston neck 56A couples to the lower platen 88 at a top of the piston neck 56A. The lower platen 88 couples to the upper platen 90 at an upper surface of the lower platen 88. The lower platen 88 and the upper platen 90 couple to the pedestal 92 at centers of the lower and upper platens, 88 and 90. The pedestal 92 couples to the pneumatic cylinder 86 at a lower end of the pedestal 92. The pedestal 92 includes a vacuum port 94, which provides vacuum for a pedestal vacuum chuck 96.

It will be readily apparent to one skilled in the art that the preferred pressure chamber 30A includes a vacuum line to the vacuum port 94 and a pneumatic line to the pneumatic cylinder 86.

Figure 7A:
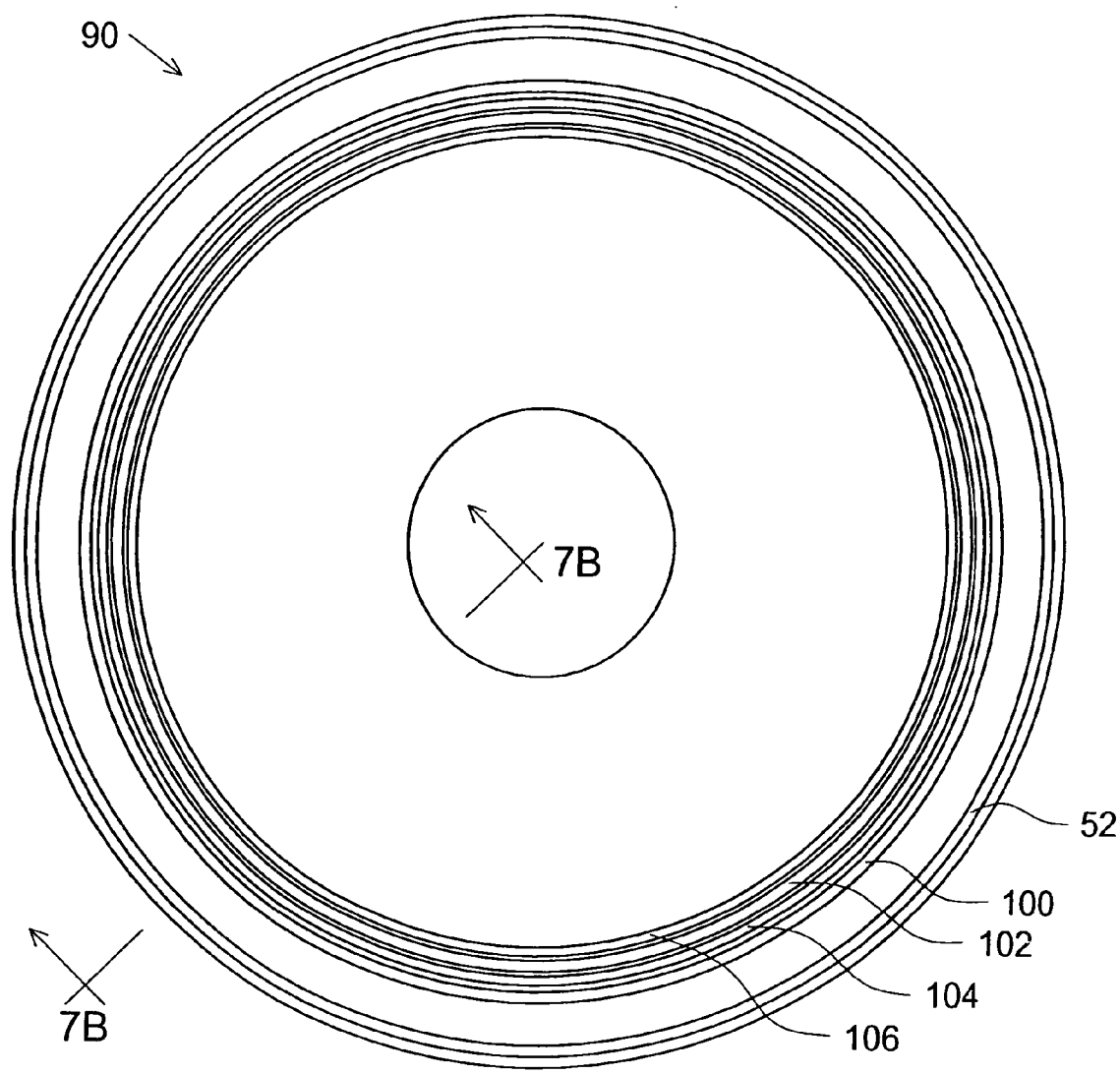
FIGS. 7A through 7C illustrate an upper platen of the present invention.

A top view of the upper platen 90 is illustrated in FIG. 7A. The upper platen 90 includes fourth and fifth o-ring grooves, 100 and 102, and first and second vacuum grooves, 104 and 106. In operation, fourth and fifth o-rings occupy the fourth and fifth o-ring grooves, 104 and 106.

Figure 7B:
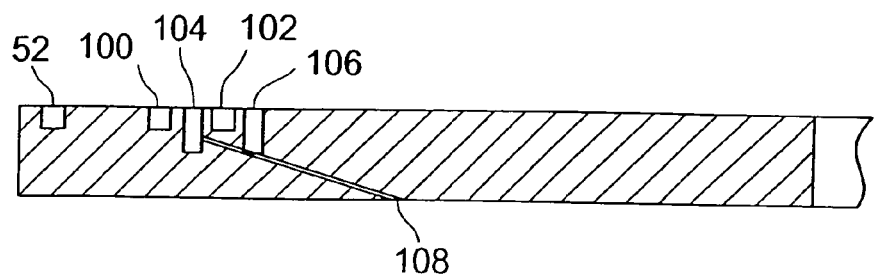

A cross-section of a portion of the upper platen 90 is illustrated in FIG. 7B. The cross section includes the fourth and fifth o-ring grooves, 100 and 102, the first and second vacuum grooves, 104 and 106, and a second vacuum port 108. In operation, the second vacuum port 108 is coupled to a vacuum pump so that vacuum is applied to the first and second vacuum grooves, 104 and 106. Thus, the fourth o-ring groove 100 and the first vacuum groove 104 form a vacuum chuck in conjunction with the lower platen 88 and the pedestal 92 (FIG. 6). The fifth o-ring groove 102 and the second vacuum groove add a redundancy to the vacuum chuck so that a leak that passes the fourth o-ring groove 100 does not prevent the vacuum chuck from functioning. The redundancy also provides backside protection for the semiconductor wafer 46 (FIG. 6).

Figure 7C:
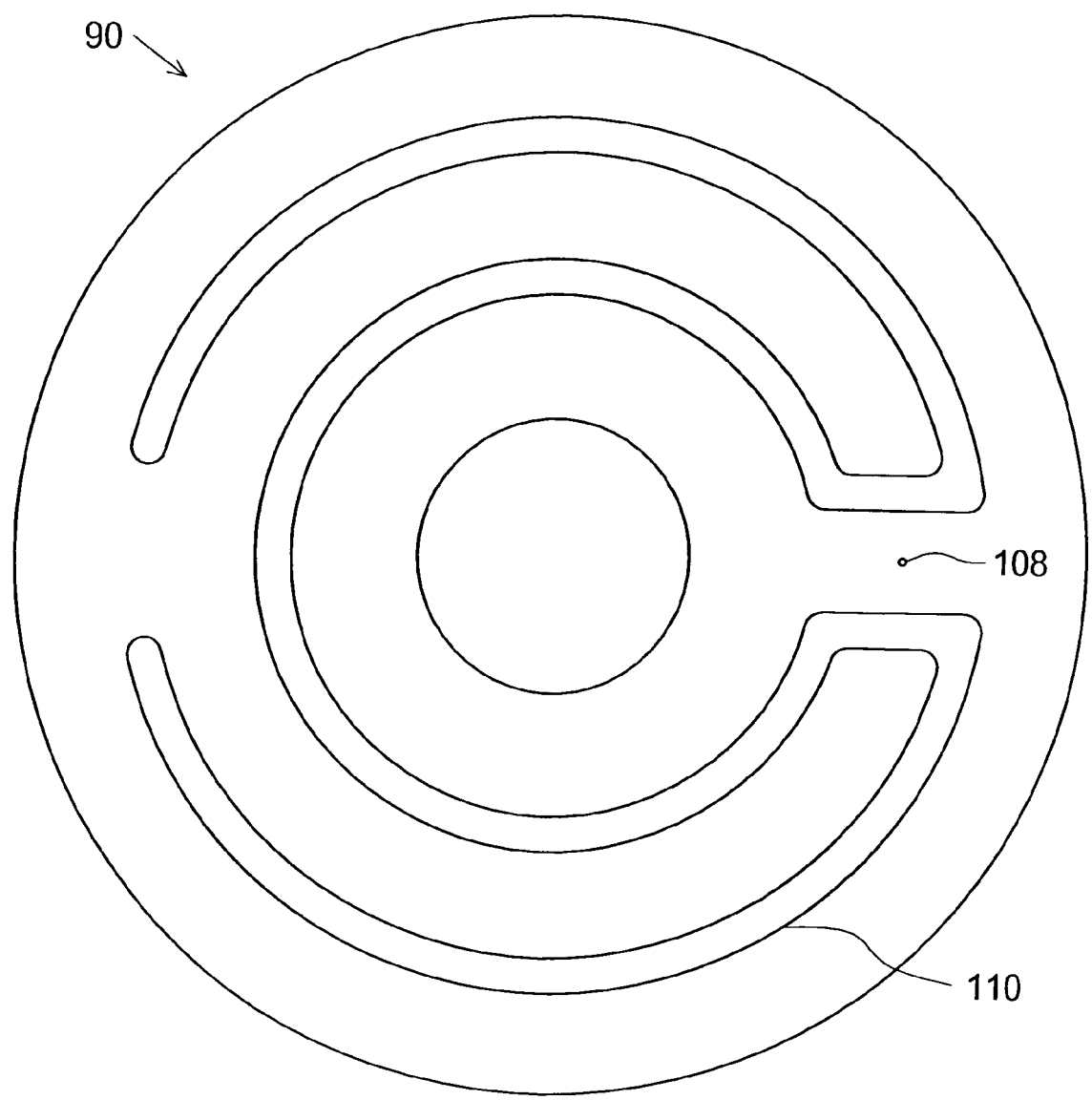

A bottom surface of the upper platen 90 is further illustrated in FIG. 7C. Preferably, the bottom surface 90 includes a resistive heating element groove 110. Preferably in operation, a resistive heating element occupies the resistive heating element groove 110 to assist in heating the wafer cavity 44 and the semiconductor wafer 46 (FIG. 6).

The upper platen 90 is preferably sized to accommodate a 300 mm wafer. An alternative upper platen can be used in lieu of the upper platen 90, where the alternative upper platen has the fourth and fifth o-ring grooves, 100 and 102, and the first and second vacuum grooves sized to accommodate a different size wafer than the 300 mm wafer, for example a 200 mm wafer. Thus, rather than replacing the wafer platen assembly 34A in the preferred pressure chamber 30A (FIG. 6), only the upper platen 90 needs to be replaced to accommodate the different size wafer.

The pressure chamber frame 10, the alternative top lid 32A, the spacer/injection ring 42, and the wafer platen assembly 34A of the preferred pressure chamber 30A are further illustrated in FIGS. 8A–8F. The wafer platen assembly 34A includes the lower platen 88, the upper platen 90, and the pedestal 92. The lower platen includes sixth and seventh o-ring grooves, 112 and 114, for sixth and seventh o-rings (not shown), which seal the lower platen 88 to the upper platen 90 and the pedestal 92, respectively. The lower platen 88 also includes a third vacuum port (not shown) which couples the vacuum pump to the second vacuum port 108 (FIG. 7B).

In FIG. 8A, the wafer platen assembly 34A is in a closed position and the wafer cavity 44 is empty. In FIG. 8B, the alternative piston 40A (FIG. 6) has lowered the wafer platen assembly 34A to a load position. In FIG. 8C, a robot end effector 116 has moved the semiconductor wafer 46 into the preferred pressure chamber 30A. In FIG. 8D, the pedestal 92 was driven by the air cylinder 86 (FIG. 6) to raise the semiconductor wafer 46 off the robot end effector 116 and the robot end effector 116 has retracted from the preferred pressure chamber 30A. As the pedestal 92 raised the semiconductor wafer 46 off the robot end effector a vacuum applied through the first vacuum port 94 secured the semiconductor wafer 46 to the pedestal vacuum chuck 96.

In FIG. 8E, the pedestal 92 was lowered by the air cylinder 86 so that a lower surface of the pedestal 92 seals to the lower platen 88 at the seventh o-ring groove 114. As the pedestal 92 reached the lower platen 88, the vacuum applied to the first and second vacuum grooves, 104 and 106, secured the semiconductor wafer 46 to the upper platen 90. In FIG. 8F, the alternative piston 40A has raised the wafer platen assembly 34A so that the wafer cavity 44 is sealed between the upper platen 90 and the spacer/injection ring 42.

Figure 9:
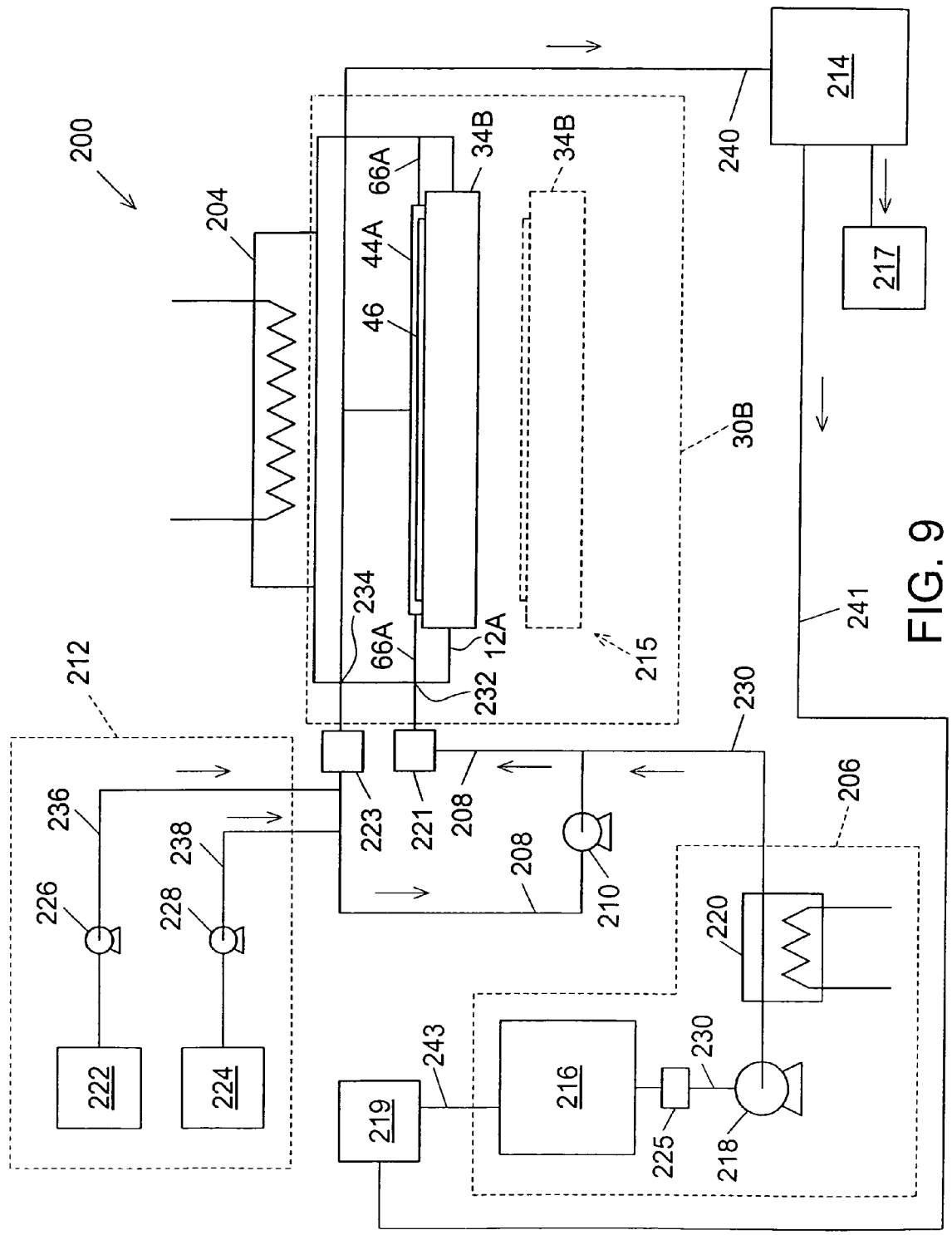
FIG. 9 illustrates a supercritical processing module and a second alternative pressure chamber of the present invention.

The supercritical processing module of the present invention, incorporating a second alternative pressure chamber of the present invention, is illustrated in FIG. 9. The supercritical processing module 200 includes the second alternative pressure chamber 30B, a pressure chamber heater 204, a carbon dioxide supply arrangement 206, a circulation loop 208, a circulation pump 210, a chemical agent and rinse agent supply arrangement 212, a separating vessel 214, a liquid/solid waste collection vessel 217, and a liquefying/purifying arrangement 219.

The second alternative pressure chamber 30B includes an alternative pressure chamber housing 12A and an alternative wafer platen 34B. The alternative pressure chamber housing 12A and the alternative wafer platen 34B form an alternative wafer cavity 44A for the semiconductor substrate 46. The alternative pressure chamber housing 12A includes alternative injection nozzles 66A. Preferably, the alternative wafer platen 34A is held against the alternative pressure chamber housing 12A using a hydraulic force. Alternatively, the alternative wafer platen 34B is held against the alternative pressure chamber housing 12A using a mechanical clamping force. Preferably, the alternative wafer platen 34B moves to a load/unload position 215 by releasing the hydraulic force. Alternatively, the alternative wafer platen 34B moves to the load/unload position 215 upon release of the mechanical clamping force. Further alternatively, the alternative wafer platen 34B moves to the load/unload position 215 by actuating a drive screw coupled to the alternative wafer platen 34B or by using a pneumatic force.

The carbon dioxide supply arrangement 206 includes a carbon dioxide supply vessel 216, a carbon dioxide pump 218, and a carbon dioxide heater 220. The chemical agent and rinse agent supply arrangement 212 includes a chemical supply vessel 222, a rinse agent supply vessel 224, and first and second high pressure injection pumps, 226 and 228.

The carbon dioxide supply vessel 216 is coupled to the second alternative pressure chamber 30B via the carbon dioxide pump 218 and carbon dioxide piping 230. The carbon dioxide piping 230 includes the carbon dioxide heater 220 located between the carbon dioxide pump 218 and the second alternative pressure chamber 30B. The pressure chamber heater 204 is coupled to the second alternative pressure chamber 30B. The circulation pump 210 is located on the circulation loop 208. The circulation loop 208 couples to the second alternative pressure chamber 30B at a circulation inlet 232 and at a circulation outlet 234. The chemical supply vessel 222 is coupled to the circulation loop 208 via a chemical supply line 236. The rinse agent supply vessel 224 is coupled to the circulation loop 208 via a rinse agent supply line 238. The separating vessel 214 is coupled to the second alternative pressure chamber 30B via exhaust gas piping 240. The liquid/solid waste collection vessel 217 is coupled to the separating vessel 214.

The separating vessel 214 is preferably coupled to the liquefying/purifying arrangement 219 via return gas piping 241. The liquefying/purifying arrangement 219 is preferably coupled to the carbon dioxide supply vessel 216 via liquid carbon dioxide piping 243. Alternatively, an off-site location houses the liquefying/purifying arrangement 219, which receives exhaust gas in gas collection vessels and returns liquid carbon dioxide in liquid carbon dioxide vessels.

The pressure chamber heater 204 heats the second alternative pressure chamber 30B. Preferably, the pressure chamber heater 204 is a heating blanket. Alternatively, the pressure chamber heater is some other type of heater.

Preferably, first and second filters, 221 and 223, are coupled to the circulation loop 208. Preferably, the first filter 221 comprises a fine filter. More preferably, the first filter 221 comprises the fine filter configured to filter 0.05 μm and larger particles. Preferably, the second filter 223 comprises a coarse filter. More preferably, the second filter 223 comprises the coarse filter configured to filter 2–3 μm and larger particles. Preferably, a third filter 225 couples the carbon dioxide supply vessel 216 to the carbon dioxide pump 218. Preferably, the third filter 225 comprises the fine filter. More preferably, the third filter 225 comprises the fine filter configured to filter the 0.05 μm and larger particles.

It will be readily apparent to one skilled in the art that the supercritical processing module 200 includes valving, control electronics, and utility hookups which are typical of supercritical fluid processing systems. Further, it will be readily apparent to one skilled in the art that the alternative injection nozzles 66A could be configured as part of the alternative wafer platen 34B rather than as part of the alternative chamber housing 12A.

In operation, the supercritical processing module is preferably used for removing the photoresist and photoresist residue from the semiconductor wafer 46. A photoresist removal process employing the supercritical processing module 200 comprises a loading step, a cleaning procedure, a rinsing procedure, and an unloading step.

In the loading step, the semiconductor wafer 46 is placed on the alternative wafer platen 34B and then the alternative wafer platen 34B is moved against the alternative chamber housing 12A sealing the alternative wafer platen 34B to the alternative chamber housing 12A and, thus, forming the alternative wafer cavity 44A.

The cleaning procedure comprises first through fourth process steps. In the first process step, the alternative wafer cavity 44A is pressurized by the carbon dioxide pump 218 to desired supercritical conditions. In the second process step, the first injection pump 226 pumps solvent form the chemical supply vessel 222 into the alternative wafer cavity 44A via the chemical supply line and the circulation loop 208. Upon reaching desired supercritical conditions, the carbon dioxide pump stops pressurizing the alternative wafer cavity 44A. Upon reaching a desired concentration of the solvent, the first injection pump 226 stops injecting the solvent. In the third process step, the circulation pump 210 circulates supercritical carbon dioxide and the solvent through the alternative wafer cavity 44A and the circulation loop 208 until the photoresist and the photoresist residue is removed from the semiconductor wafer. In the fourth process step, the wafer cavity 44A is partially exhausted while maintaining pressure above a critical pressure, then the alternative wafer cavity 44A is re-pressurized by the carbon dioxide pump 218 and partially exhausted again while maintaining the pressure above the critical pressure.

The rinsing procedure comprises fourth through seventh process steps. In the fourth process step, the alternative wafer cavity is pressurized by the carbon dioxide pump 218. In the fifth process step, the second injection pump 228 pumps a rinse agent form the rinse agent supply vessel 224 into the alternative wafer cavity 44A via the rinse agent supply line 238 and the circulation loop 208. Upon reaching a desired concentration of the rinse agent, the second injection pump 228 stops injecting the rinse agent. In the sixth process step, the circulation pump 210 circulates the supercritical carbon dioxide and the rinse agent through the alternative wafer cavity 44A and the circulation loop 208 for a pre-determined time. In the seventh process step, the alternative wafer cavity 44A is de-pressurized. Alternatively, it may be found that the fifth and sixth process steps are not needed.

In the unloading step, the alternative wafer platen 34B is moved to the load/unload position 215 where the semiconductor is removed from the alternative wafer platen 34B.

Preferably, at least two of the supercritical processing modules of the present invention form part of a multiple workpiece processing system, which provides simultaneous processing capability for at least two of the semiconductor wafers. The multiple workpiece processing system is taught in U.S. patent application Ser. No. 09/704,642, filed on Nov. 1, 2000, which is incorporated in its entirety by reference. Alternatively, the supercritical processing module of the present invention along with a non-supercritical processing module forms part of a multiple process semiconductor processing system. The multiple process semiconductor processing system is taught in U.S. patent application Ser. No. 09/704,641, filed Nov. 1, 2000, which is incorporated in its entirety by reference. Further alternatively, the supercritical processing module of the present invention forms part of a stand-alone supercritical processing system employing a single supercritical processing module of the present invention.

A third alternative pressure chamber of the present invention comprises the second alternative pressure chamber 34B plus a surface enhancement feature of the alternative chamber housing 12A above the semiconductor substrate 46. The surface enhancement feature comprises a height variation from an outer diameter of the alternative wafer cavity 44A to a center of the alternative wafer cavity 44A in order to provide more uniform molecular speeds above the semiconductor substrate 46. Preferably, the height variation comprises a high point at the outer diameter of the alternative wafer cavity 34B to a low point at the center of the alternative wafer cavity 34B providing a more constricted space at the center of the wafer cavity 34B. Alternatively, the height variation comprises the high point at the outer diameter of the alternative wafer cavity 34B, the low point between the outer diameter and the center of the alternative wafer cavity 34B, and an intermediate point at the center of the alternative wafer cavity 34B.

It will be readily apparent to one skilled in the art that the preferred pressure chamber 30A and the first through third alternative pressure chambers of the present invention are appropriate for high pressure processing that is below supercritical conditions.

It will be readily apparent to one skilled in the art that other various modifications may be made to the preferred embodiment without departing from the spirit and scope of the invention as defined by the appended claims.

We claim:

1. A high pressure chamber for processing a semiconductor substrate, the high pressure chamber comprising:
   a. a platen comprising a first sealing surface and a region for holding the semiconductor substrate the platen further comprising:
      i. an upper platen having a first aperture; and
      ii. a lower platen coupled to the upper platen, the lower platen having a second aperture substantially concentric with the first aperture;
   b. a chamber housing comprising:
      i. a plurality of posts, each pair of posts defining one of a plurality of windows, each window providing access to the platen; and
      ii. a second sealing surface; and
   c. a single mechanical drive mechanism having a single pressure source for forming and maintaining a wafer cavity containing the region for holding the semiconductor substrate, the single mechanical drive mechanism coupling the platen to the chamber housing and configured (i) to separate the first sealing surface from the second sealing surface for loading of the semiconductor substrate and (ii) to cause the first sealing surface and the second sealing surface to contact, thus forming and maintaining the wafer cavity during high pressure processing;
   d. a spacer, wherein the first sealing surface and the second sealing surface both seal to the spacer;
   e. a pedestal having a neck coupled to an upper portion, the neck slidably mounted within the second aperture, the upper portion sized to fit within the first aperture to form a part of the region for holding the semiconductor substrate; and
   f. a first piston coupled to the neck and configured to slide the neck within the second aperture, thereby extending the upper portion from the upper platen and moving the upper portion into the upper platen.

2. The system of claim 1, wherein the single mechanical drive mechanism comprises a second piston having a hollow neck containing the first piston.

3. The system of claim 1, wherein the upper platen has an upper surface containing a vacuum groove.

4. The system of claim 2, wherein the vacuum groove is coupled to a vacuum port.

5. The system of claim 3, wherein the upper surface further comprises an o-ring groove, the o-ring groove and vacuum groove together forming a vacuum chuck.

6. The system of claim 1, further comprising:
   a. a supercritical condition generator coupled to the inlet and the outlet; and
   b. a chemical agent and rinse agent supply arrangement coupled to the inlet.

7. The system of claim 6, wherein the supercritical condition generator comprises:
   a. a first pump;
   b. a supply vessel coupled to the first pump; and
   c. a heater coupling the supply vessel to the inlet.

8. The system of claim 7, further comprising a circulation loop coupled to the inlet and the outlet, the circulation loop comprising a second pump and a filter.

9. The system of claim 8, further comprising a return gas arrangement coupling the outlet to the supercritical condition generator.

10. The system of claim 9, wherein the return gas arrangement comprises a separating vessel.

11. The system of claim 10, wherein the return gas arrangement further comprises a liquefying/purifying arrangement.

12. The system of claim 11, wherein the supply vessel contains carbon dioxide.

13. A system for processing a semiconductor substrate, the system comprising:
   a. a platen comprising a first sealing surface and a region for holding the semiconductor substrate the platen further comprising:
      i. an upper platen having a first aperture; and ii. a lower platen coupled to the upper platen, the lower platen having a second aperture substantially concentric with the first aperture;
b. a chamber housing comprising:
  i. a second sealing surface;
  ii. an inlet coupled to the region for holding the semiconductor substrate;
  iii. and an outlet coupled to region for holding the semiconductor substrate; and
c. a single mechanical drive mechanism having a single pressure source for forming and maintaining a wafer cavity containing the region for holding the semiconductor substrate, the single mechanical drive mechanism coupling the platen to the chamber housing and configured (i) to separate the first sealing surface from the second sealing surface for loading of the semiconductor substrate and (ii) to cause the first sealing surface and the second sealing surface to contact, thus forming and maintaining the wafer cavity during high pressure processing;
d. a spacer, wherein the first sealing surface and the second sealing surface both seal to the spacer;
e. a pedestal having a neck coupled to an upper portion, the neck slidably mounted within the second aperture, the upper portion sized to fit within the first aperture to form a part of the region for holding the semiconductor substrate; and
f. a first piston coupled to the neck and configured to slide the neck within the second aperture, thereby extending the upper portion from the upper platen and moving the upper portion into the upper platen.

14. The system of claim 13, wherein the single mechanical drive mechanism comprises a second piston having a hollow neck containing the first piston.

15. The system of claim 13, wherein the upper platen has an upper surface containing a vacuum groove.

16. The system of claim 15, wherein the vacuum groove is coupled to a vacuum port.

17. The system of claim 16, wherein the upper surface further comprises an o-ring groove, the o-ring groove and vacuum groove together forming a vacuum chuck.

18. The system of claim 13, further comprising:
a. a supercritical condition generator coupled to the inlet and the outlet; and
b. a chemical agent and rinse agent supply arrangement coupled to the inlet.

19. The system of claim 18, wherein the supercritical condition generator comprises:
a. a first pump;
b. a supply vessel coupled to the first pump; and
c. a heater coupling the supply vessel to the inlet.

20. The system of claim 19, further comprising a circulation loop coupled to the inlet and the outlet, the circulation loop comprising a second pump and a filter.

21. The system of claim 20, further comprising a return gas arrangement coupling the outlet to the supercritical condition generator.

22. The system of claim 21, wherein the return gas arrangement comprises a separating vessel.

23. The system of claim 22, wherein the return gas arrangement further comprises a liquifying/purifying arrangement.

24. The system of claim 23, wherein the supply vessel contains carbon dioxide.

* * * * *